(12) United States Patent
Fratin et al.

(10) Patent No.: US 12,219,784 B2
(45) Date of Patent: Feb. 4, 2025

(54) MEMORY DEVICE AND METHOD FOR MANUFACTURING THE SAME

(71) Applicant: Micron Technology, Inc., Boise, ID (US)

(72) Inventors: Lorenzo Fratin, Buccinasco (IT); Paolo Fantini, Vimercate (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 599 days.

(21) Appl. No.: 17/431,660

(22) PCT Filed: Jul. 22, 2020

(86) PCT No.: PCT/IB2020/020041
§ 371 (c)(1),
(2) Date: Aug. 17, 2021

(87) PCT Pub. No.: WO2022/018476
PCT Pub. Date: Jan. 27, 2022

(65) Prior Publication Data
US 2022/0302210 A1    Sep. 22, 2022

(51) Int. Cl.
*H10B 63/00*    (2023.01)
*H10N 70/00*    (2023.01)
*H10N 70/20*    (2023.01)

(52) U.S. Cl.
CPC ......... *H10B 63/845* (2023.02); *H10N 70/066* (2023.02); *H10N 70/231* (2023.02)

(58) Field of Classification Search
CPC .. H10B 63/845; H10N 70/066; H10N 70/231; H10N 70/20; H10N 70/823;
(Continued)

(56) References Cited

U.S. PATENT DOCUMENTS 10,381,409 B1 *   8/2019   Zhou ................... H10N 70/841
2007/0158633 A1   7/2007   Lai et al.
(Continued)

FOREIGN PATENT DOCUMENTS

CN    104040746 A    9/2014
CN    110447115 A    11/2019
(Continued)

OTHER PUBLICATIONS

Mameli et .al. "Area-Selective Atomic Layer Deposition of SiO2 Using Acetylacetone as a Chemoselective Inhibitor in an ABC-Type Cycle" ACS Nano 2017 (Year: 2017).*
International Search Report and Written Opinion received for PCT Patent Application No. PCT/IB2020/020041, mailed on Apr. 21, 2021, 8 pages.
Taiwanese Patent Office, "Office Action and Search Report", issued in connection with Taiwanese Patent Application No. 110126355 dated Apr. 26, 2022 (7 pages).

*Primary Examiner* — Joseph C. Nicely
*Assistant Examiner* — Alvin L Lee
(74) *Attorney, Agent, or Firm* — Holland & Hart LLP

(57) ABSTRACT

Methods for, apparatuses with and vertical 3D memory devices are described. A vertical 3D memory device may comprise: a plurality of contacts associated with a plurality of digit lines and extending through a substrate; a plurality of word line plates separated from one another by respective dielectric layers and including a first plurality of word line plates and a second plurality of word line plates; a first dielectric material positioned between the first plurality and the second plurality of word line plates, the first dielectric material extending in a serpentine shape over the substrate; a conformal material positioned between the first dielectric material and the first and second plurality of word line plates, respectively; a plurality of spacers; a plurality of pillars coupled with the plurality of contacts; and a plurality of storage elements each comprising chalcogenide material positioned in a recess.

28 Claims, 20 Drawing Sheets

(58) Field of Classification Search
CPC ........... H10N 70/8825; H10N 70/8828; H10N 70/068; G11C 13/0002
See application file for complete search history.

(56) References Cited

U.S. PATENT DOCUMENTS

| | | |
|---|---|---|
| 2016/0300885 A1 | 10/2016 | Konevecki et al. |
| 2017/0141307 A1 | 5/2017 | Navarro |
| 2018/0211703 A1* | 7/2018 | Choi ...................... H10B 63/24 |
| 2019/0067571 A1* | 2/2019 | Fratin .................. H10N 70/231 |
| 2020/0203429 A1* | 6/2020 | Fantini ................ H10B 63/845 |
| 2021/0202514 A1* | 7/2021 | Han ..................... H10B 63/845 |

FOREIGN PATENT DOCUMENTS

| | | | |
|---|---|---|---|
| EP | 2017906 A1 | 1/2009 | |
| TW | 201633526 A | 9/2016 | |
| TW | 201946253 A | 12/2019 | |
| WO | 2013/192216 A2 | 12/2013 | |
| WO | WO-2017160233 A1 * | 9/2017 | ......... G11C 13/0004 |

* cited by examiner

MEMORY DEVICE AND METHOD FOR MANUFACTURING THE SAME

CROSS REFERENCE

The present application for patent is 371 national phase filing of International Application No. PCT/IB2020/020041 by Fratin et al., entitled "MEMORY DEVICE AND METHOD FOR MANUFACTURING THE SAME," filed Jul. 22, 2020, which is assigned to the assignee hereof, and which is expressly incorporated by reference in its entirety herein.

DESCRIPTION

Technical Field

The following disclosure relates generally to a memory array that includes at least one memory cell and more specifically to a vertical 3D (three dimensional) memory device and method for manufacturing the same.

Background Art

Memory devices are widely used to store information in various electronic devices such as computers, wireless communication devices, cameras, digital displays, and the like.

Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memories, and others. Memory devices may be volatile or non-volatile.

Improving memory devices, generally, may include increasing memory cell density, increasing read/write speed, increasing reliability, increasing data retention, reducing power consumption, or reducing manufacturing costs, among other metrics. Solutions for saving space in the memory array, increasing the memory cell density, or decreasing overall power usage of the memory array with three-dimensional vertical architecture may be desired.

DETAILED DESCRIPTION

Figure 1:
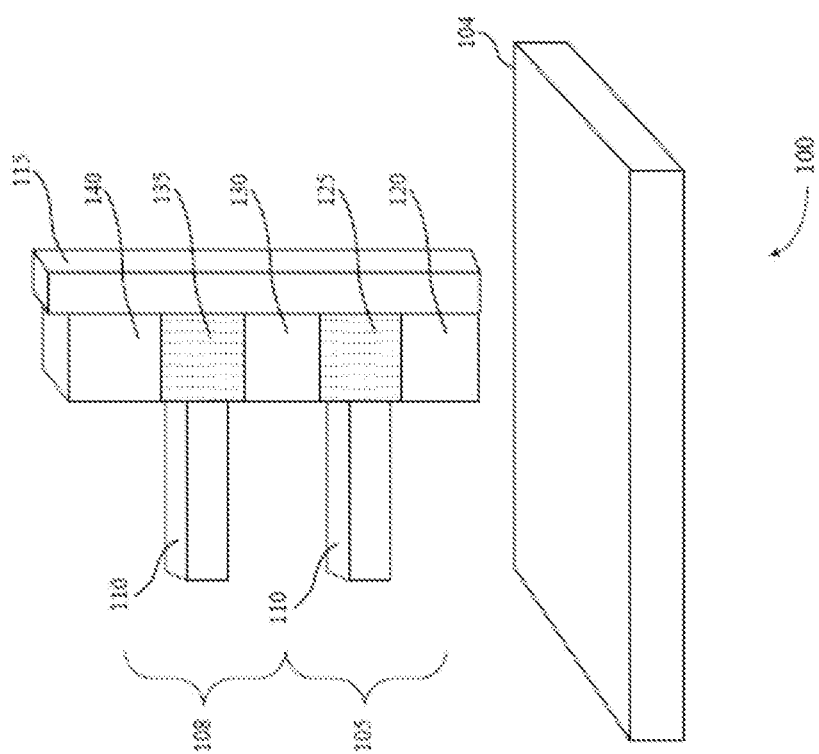
FIG. 1 illustrates an example of a vertical 3D memory array in accordance with examples as disclosed herein.

The present disclosure relates to three-dimensional (3D) vertical self-selecting memory arrays with an increased density of memory cells and compacted memory cells, and methods of manufacturing the same. The memory arrays may include an arrangement of conductive contacts and openings through alternative layers of conductive materials and insulative material that may decrease the spacing between the memory cells while maintaining a dielectric thickness to sustain the voltage to be applied to the memory array. An active area of a memory cell in the memory arrays may be compacted or shrinked because of the formation of spacers adjacent thereto.

In some examples, a 3D memory array may include a substrate with a plurality of contacts arranged in a pattern (e.g., a geometric pattern) and a first insulative material (e.g., a dielectric material) formed on the substrate. A plurality of planes of a conductive material may be separated from one another by a second insulative material (e.g., a dielectric material) and formed on the substrate material. The planes of conductive material may be examples of word lines.

During manufacturing of such a memory array, a trench may be formed in a shape that separates odd and even word line planes to create "comb" structures (e.g., structures that look like a tool with fingers and space between the fingers). The trench may have any geometric configuration and include odd and even groups of fingers of the comb facing one another at a fixed distance. In some examples, the trench may be formed in a serpentine shape. The trench may divide each plane of conductive material into two sections or two plates. Each place of conductive material may be an example of a word line plate. In some examples, inside the trench, the planes of the conductive material may be etched in such a way that the dielectric materials and the conductive materials form a plurality of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer. The sacrificial layer and the insulative layer may form a serpentine shape. In some examples, other geometric configurations of the trench are contemplated.

Portions of the sacrificial layer and the insulative layer may be removed to form openings. The openings may expose portions of the substrate, the plurality of conductive contacts, and portions of the conductive materials and dielectric materials. In some examples, walls of the sacrificial layer and the insulative layer may be exposed in the openings. Spacers may be formed on the walls of the sacrificial layer. In some examples, the spacers may be formed, or grow, only on the walls of the sacrificial layer instead of the insulative layer. A storage element material (e.g., the chalcogenide material) may be deposited in the openings and between respective two spacers. The storage element material may fill the recesses formed by the dielectric materials and the conductive materials. The storage element material may be partially removed from the openings such that only the storage element materials in the recesses remain.

Conductive pillars may be formed in the openings that include the storage element materials in the recesses. The conductive pillars may be examples of digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material.

Such configurations of a memory array and the methods of manufacturing may allow a higher-density of memory cells and compacted memory cells relative to previous solutions. Each memory cell (e.g., storage element material) may be recessed inside opposite sides of the conductive pillar to ensure the cell isolation. Such a configuration may allow for a tighter control of cell thickness and dimension with respect to some previous solutions. Each plane of conductive material that intersects the conductive pillar may form two memory cells addressed by a first word line plate in the plane and a second word line plate in the plane. Each conductive pillar may be decoded by a transistor positioned at the bottom or top of the memory array. The transistor may be an example of a digit line selector formed in a regular matrix.

Features of the disclosure are initially described in the context of a memory array as described with reference to FIG. 1. Features of the disclosure are described in the context of different views of example 3D memory arrays during manufacturing steps as described with reference to FIGS. 2A-5C. These and other features of the disclosure are further illustrated by and described with reference to flowcharts that relate to vertical 3D memory array architecture as described with references to FIG. 6 and memory apparatus described with reference to FIG. 8. These and other features of the disclosure are further described in the context of an example 3D memory cell with reference to FIG. 7.

FIG. 1 illustrates an example of a 3D memory array 100 in accordance with aspects of the present disclosure. Memory array 100 may include a first array or deck 105 of memory cells that is positioned above a substrate 104 and a second array or deck 108 of memory cells on top of the first array or deck 105. In some examples, the memory array 100 may have a different orientation relative to the substrate 104, such as an orientation rotated 90° from the orientation shown in FIG. 1, where the first array or deck 105 of memory cells may be positioned adjacent to the second array or deck 108 of memory cells.

Memory array 100 may include word lines 110 and digit lines 115. Memory cells of the first deck 105 and the second deck 108 each may have one or more self-selecting memory cells. Although some elements included in FIG. 1 are labeled with a numeric indicator, other corresponding elements are not labeled, though they are the same or would be understood to be similar.

A stack of memory cells may include a first dielectric material 120, a storage element material 125 (e.g., chalcogenide material), a second dielectric material 130, a storage element material 135 (e.g., chalcogenide material), and a third dielectric material 140. The self-selecting memory cells of the first deck 105 and second deck 108 may, in some examples, have common conductive lines such that corresponding self-selecting memory cells of each deck 105 and 108 may share digit lines 115 or word lines 110.

In some examples, a memory cell may be programmed by providing an electric pulse to the cell, which may include a memory storage element. The pulse may be provided via a first access line (e.g., word line 110) or a second access line (e.g., digit line 115), or a combination thereof. In some cases, upon providing the pulse, ions may migrate within the memory storage element, depending on the polarity of the memory cell. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

The architecture of memory array 100 may be referred to as a vertical 3D cross-point architecture, in some cases, in which a memory cell is formed at a topological cross-point between a word line 110 and a digit line 115. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 1 shows two memory decks 105 and 108, other configurations are possible. In some examples, a single memory deck of self-selecting memory cells may be constructed above a substrate 104, which may be referred to as a two-dimensional memory. In some examples, a three or four memory decks of memory cells may be configured in a similar manner in a three-dimensional cross point architecture.

The memory array 100 may include a substrate 104 with a plurality of contacts arranged in a grid or staggered pattern. In some cases, the plurality of contacts may extend through the substrate and couple with an access line of the memory array 100. The memory array 100 may include a plurality of planes of a conductive material separated by one another by a second insulative material formed on the first insulative material on the substrate material. Each of the plurality of planes of the conductive material may include a plurality of recesses formed therein. The plurality of planes, for example, word line plates, may be obtained by a replacement process by using a sacrificial layer (e.g., a conformal layer) for etching during a stack deposition processing step, removing the conformal layer after cell definition and replacing the conformal layer with a more conductive material.

An insulative material may be formed in a serpentine shape through the second insulative material and the conductive material. A plurality of conductive pillars may be arranged in openings to extend substantially perpendicular to the plurality of planes of the conductive material and the substrate. Each respective one of the plurality of conductive pillars may be coupled to a different one of the conductive contacts.

In some examples, the memory decks 105 and 108 may include chalcogenide material configured to store logic states. For example, the memory cells of the memory decks 105 and 108 may be examples of self-selecting memory cells. A chalcogenide material may be formed in the plurality of recesses such that the chalcogenide material in each respective one of the plurality of recesses is at least partially in contact with one of the plurality of conductive pillars.

Figure 2A:
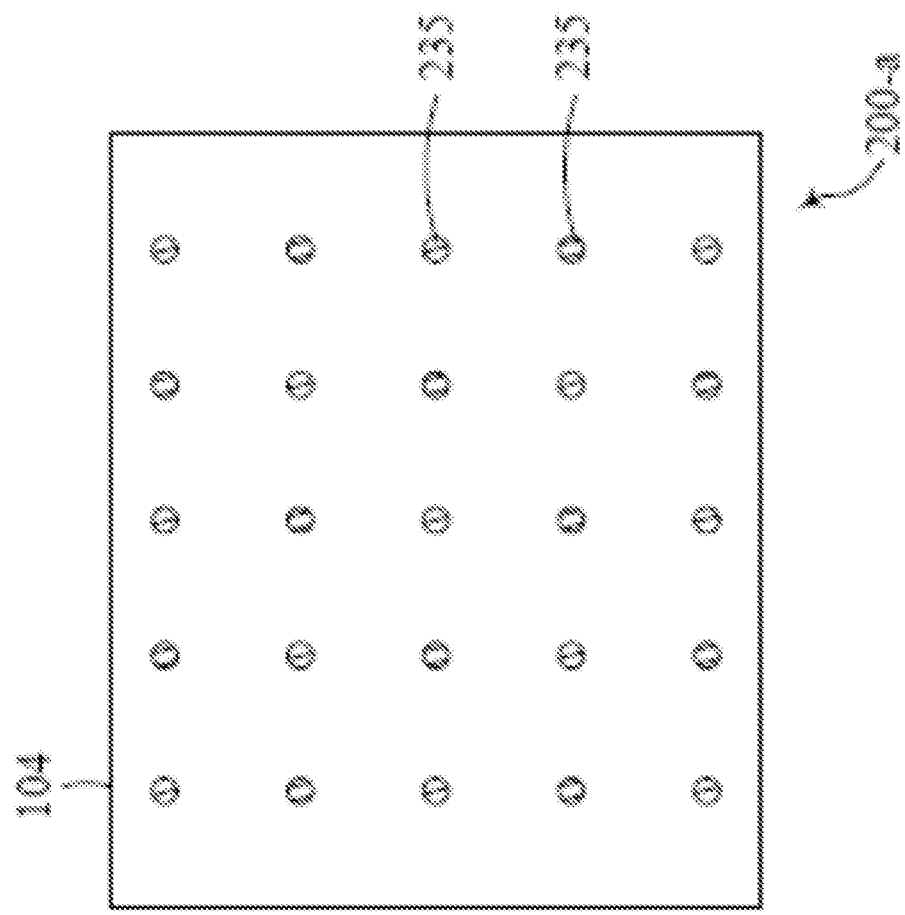
FIG. 2A illustrates a bottom view of an example 3D memory array in accordance with examples as disclosed herein.

FIG. 2A illustrates a bottom view of an example 3D memory array 200-a in accordance with examples as disclosed herein. The memory array 200-a may include a plurality of conductive contacts 235 formed in a substrate 104 and extend through the substrate 104 and couple with an access line of the memory array 100. For example, the substrate 104 may be a dielectric material, such as a dielectric film.

A single conductive contact of the plurality of conductive contacts 235 may be configured to couple any single vertical pillar with a transistor (not shown). The plurality of conductive contacts 235 may be arranged in a grid pattern. In some examples, a respective one of the plurality of conductive contacts 235 may be surrounded by up to eight other conductive contacts 235. In some examples, the plurality of conductive contacts 235 may be arranged in a staggered pattern or a hexagonal pattern. For example, a respective one of the plurality of conductive contacts 235 may be surrounded by up to six other conductive contacts 235.

Figure 2B:
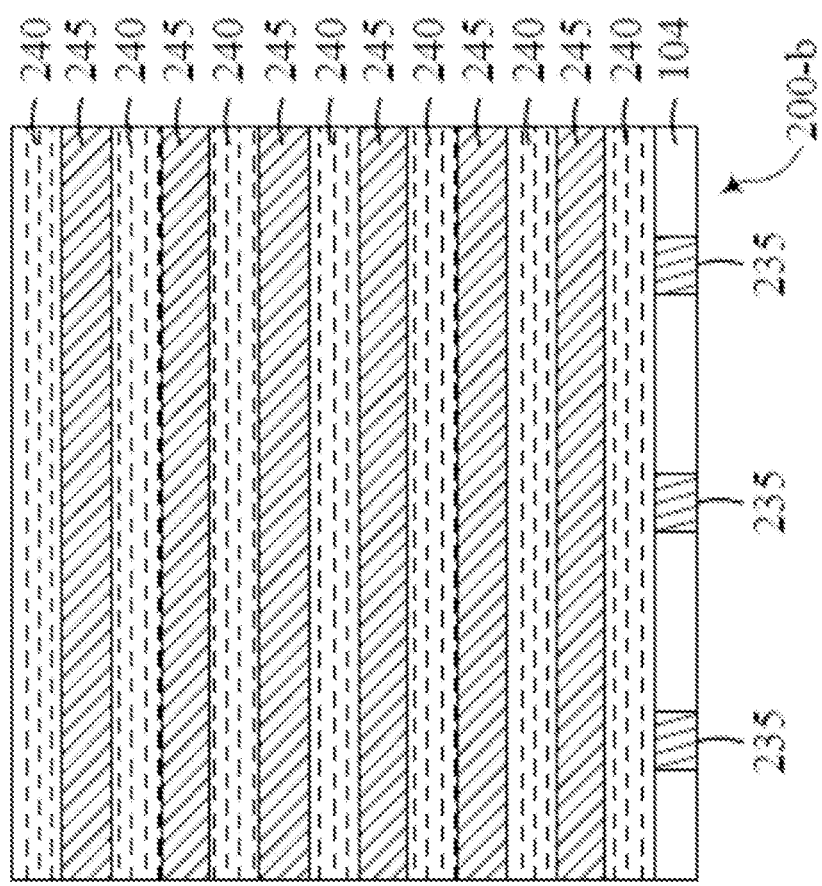
FIG. 2B illustrates a side view of an example 3D memory array in accordance with examples as disclosed herein.

FIG. 2B illustrates a side view of an example 3D memory array 200-b in accordance with examples as disclosed herein. The memory array 200-b may include plurality of conductive contacts 235 may be formed in the substrate 104. The memory array 200-b may also include a plurality of stacked planes of an insulative material 240 and a plurality of stacked planes of a conductive material 245 (e.g., word lines planes or word line plates). The stacked planes of conductive material 245 may be separated in a z-direction (e.g., separated vertically) from one another by the plurality of planes of the insulative material 240. For example, a first plane (e.g., a bottom plane) of the second insulative material 240 may be formed (e.g., deposited) on the plane of the substrate 104, and then a plane of the conductive material 245 may be formed on the first plane of the second insulative material 240. In some examples, a layer of the first insulative material 240 may be deposited on the substrate 104. In some examples, the conductive material 245 may be a layer of conductive carbon or other conductive layer compatible with active materials. In some examples, the conductive material 245 may include conductive layers separated by active material through a protective barrier. The conductive material 245 may be configured to function as at least one word line plate. In some examples, the conductive material 245 and the insulative material 240 form a plurality of layers, such as alternating layers.

Additional planes of the second insulative material 240 may be formed on the conductive material 245 in an alternating manner as illustrated in FIG. 2B. The second insulative material 240 may be a dielectric material, such as a dielectric film or layer. In some examples, the second insulative material 240 and the substrate 104 may be the same type of insulative material. Examples of the insulative materials disclosed herein include, but are not limited to dielectric materials, such as silicon oxide.

Each respective one of the plurality of planes of the conductive material 245 may be at (e.g., form) a different level of the 3D memory array 200-b. Individual planes of material that form memory cells may be referred to as a deck of the 3D memory array 200-b. The conductive material 245 may comprise (e.g., be formed of) a metallic (or semi-metallic) material or a semiconductor material such as a doped polysilicon material, among others. In some examples, the conductive material 245 may be a plane of conductive carbon.

Six planes of the conductive material 245 and seven planes of the second insulative material 240 are shown in FIG. 2B. The seventh plane of the second insulative material 240 may be a topmost layer of the 3D memory array 200-b. The quantity of planes of the conductive material 245 and the second insulative material 240 are not limited to the quantities illustrated in FIG. 2B. The conductive material 245 and the second insulative material 240 may be arranged into more than six decks or less than six decks.

FIGS. 3A-3E illustrate various views of example 3D memory arrays 200-c, 200-d, 200-e, and 200-f during a series of steps or processes that may be performed to form a stacked memory device, in accordance with examples as disclosed herein. Specifically, in FIGS. 3A-3E, a process of forming even and odd word line planes is shown.

Figure 3A:
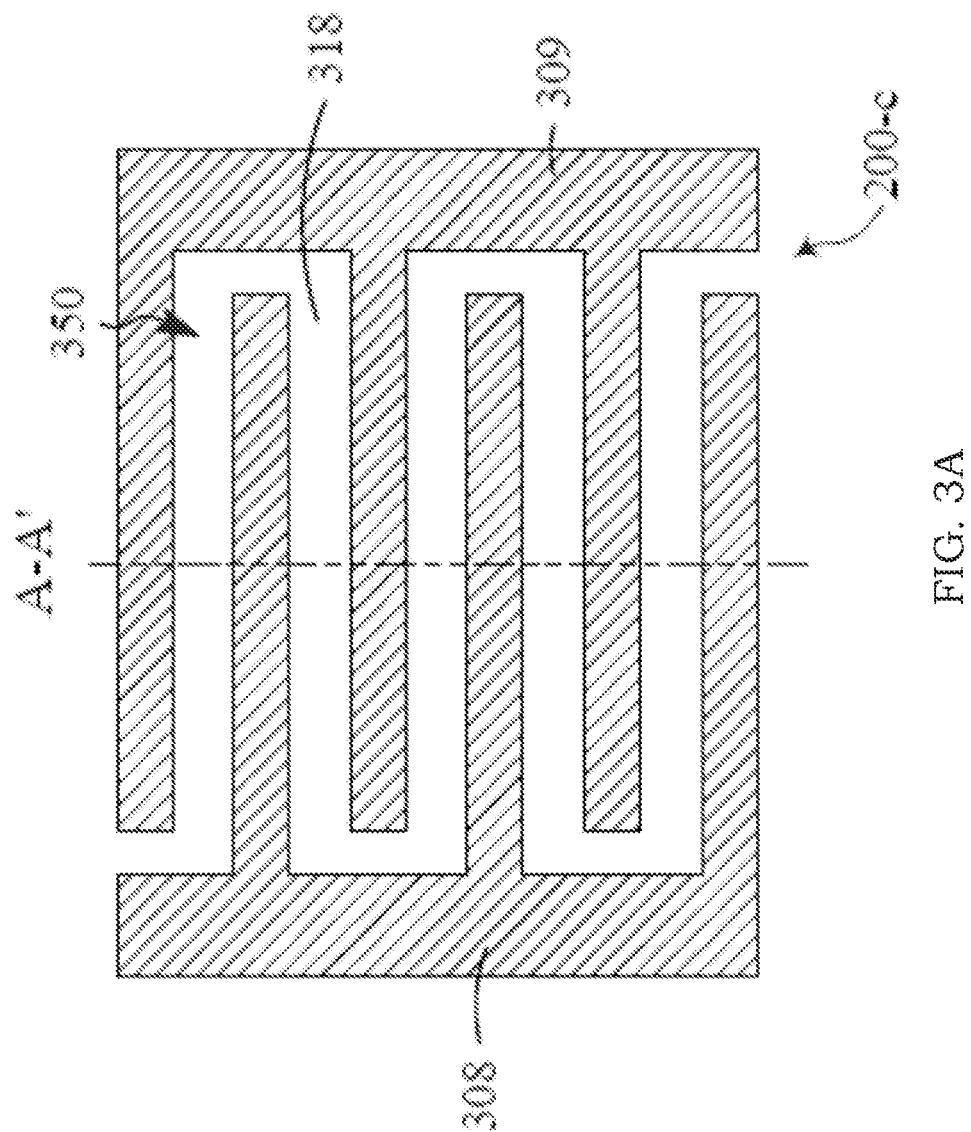
FIGS. 3A through 3E illustrate various views of example 3D memory array in accordance with examples as disclosed herein.
Figure 3B:
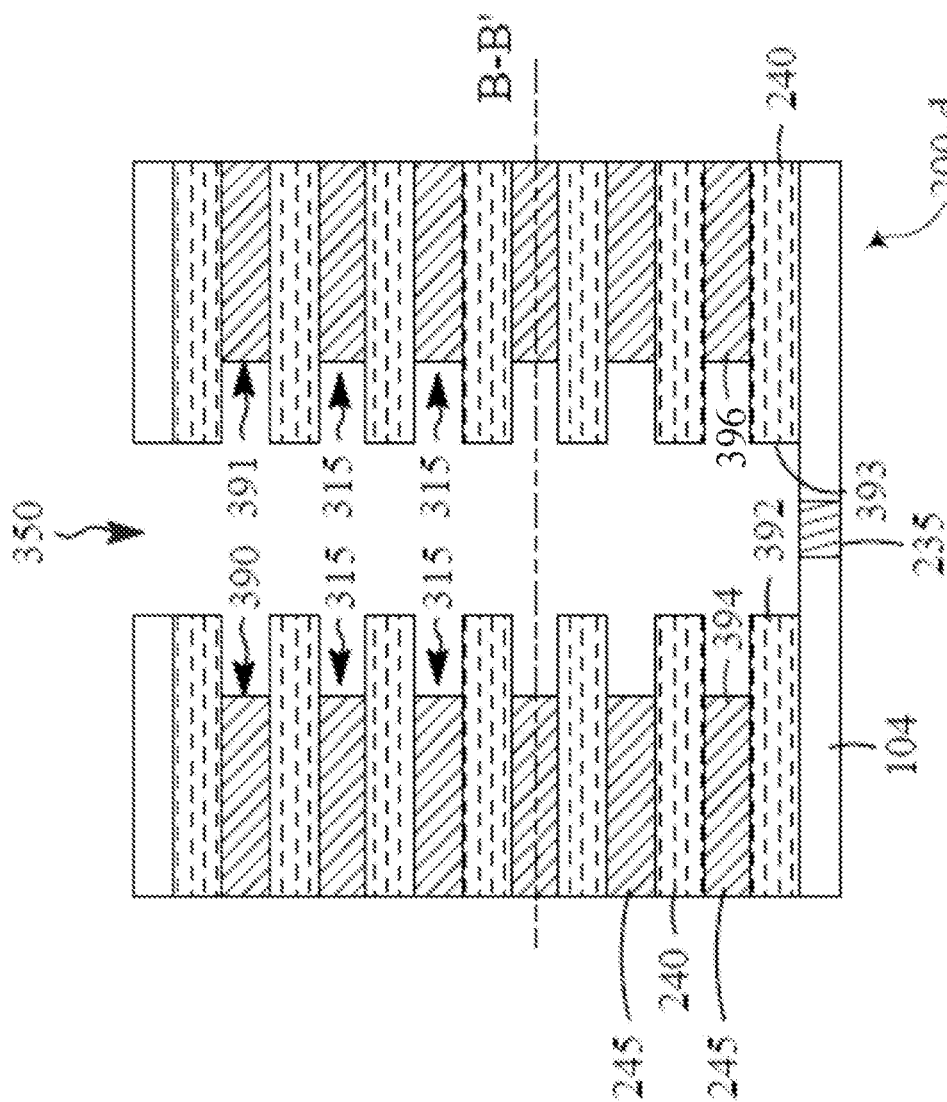
Figure 3C:
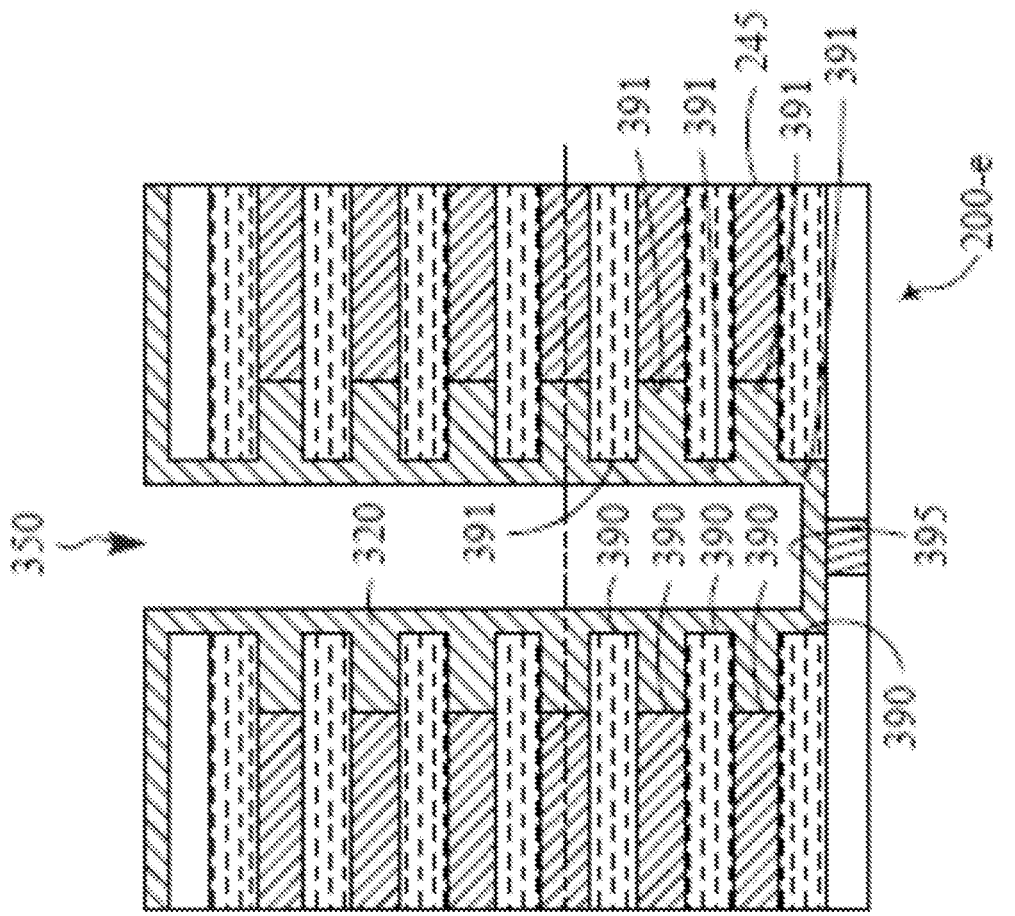
Figure 3D:
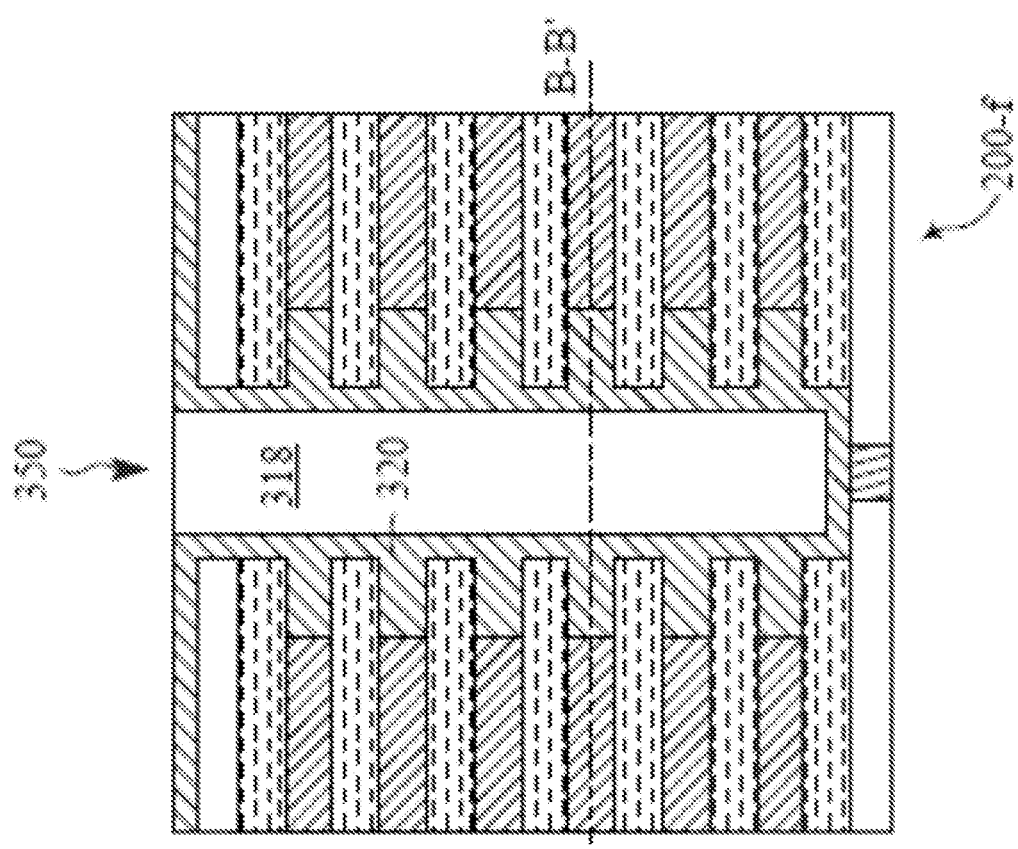
Figure 3E:
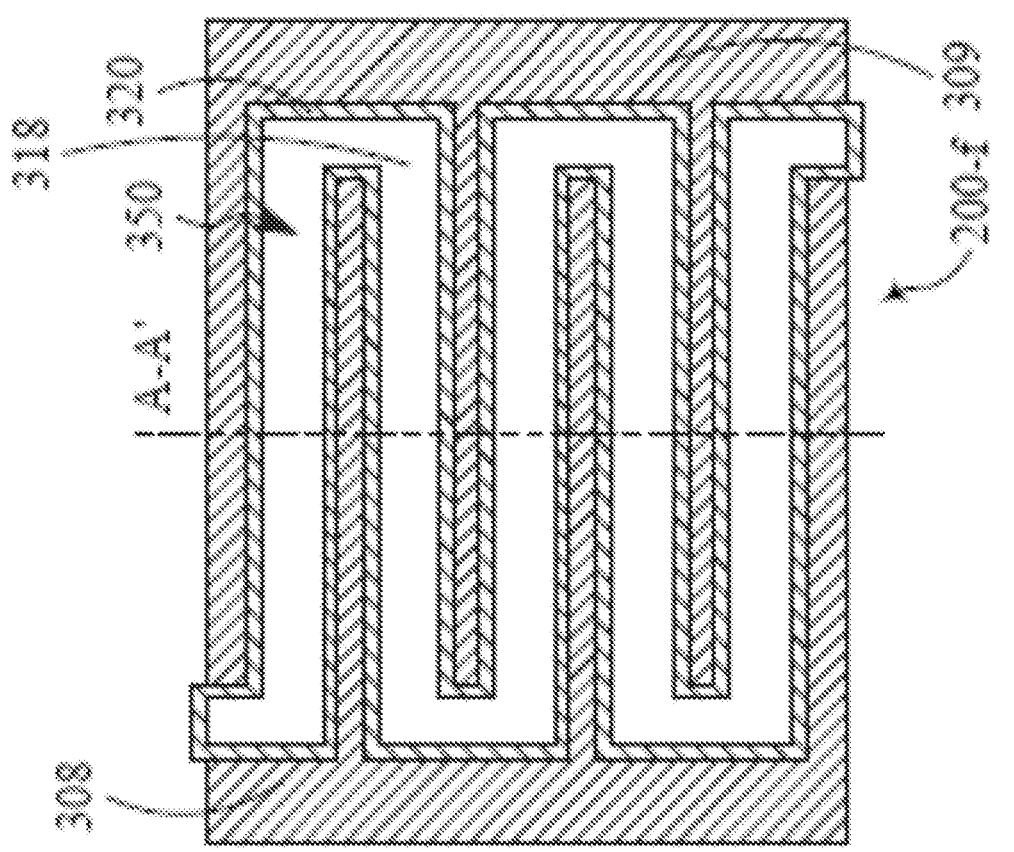

FIG. 3A illustrates a top view of an example 3D memory array 200-c, which may be an example of the memory array 200-b illustrated in FIG. 2B after a trench 350 is formed. FIG. 3B illustrates a cross-sectional view of an example 3D memory array 200-d along section line A-A' during a process step subsequent to what is illustrated in FIG. 3A. FIG. 3C illustrates a cross-sectional view of an example 3D memory array 200-e along section line A-A' during a process step subsequent to what is illustrated in FIG. 3B. FIG. 3D illustrates a cross-sectional view of an example 3D memory array 200-f along section line A-A' during a process step subsequent to what is illustrated in FIG. 3C. FIG. 3E illustrates a top view of an example 3D memory array 200-f of section line B-B' during a process step subsequent to what is illustrated in FIG. 3C. FIGS. 3A-3E illustrate a series of steps or processes that may be performed to form a stacked memory device.

FIG. 3A illustrates forming the trench 350 through the alternating planes of conductive material 245 (shown in FIG. 3B) and the second insulative material 240 (shown in FIG. 3B) of memory array 200-c. The trench 350 may expose the substrate 104 (previously shown in FIGS. 2A and 2B) and the conductive contacts 235 (previously shown in FIGS. 2A and 2B) at the bottom of the trench 350.

The trench 350 may be etched from top to bottom and etched in a serpentine-shape. For instance, the trench 350 may pass over a row of the conductive contacts 235 in a first direction (e.g., from left to right) and then pass over an adjacent row of the conductive contacts 235 in a second direction that is opposite to the first direction (e.g., from right to left). With reference to the example of FIG. 3A, the trench 350 passes over a first row of the conductive contacts 235 from left to right, then "turns" and passes over the next (second) row of conductive contacts 235 (adjacent to the first row) from right to left. The trench 350 "turns" again and passes over the next (third) row of conductive contacts 235 (adjacent to the second row) from left to right. The trench 350 "turns" again and passes over the next (fourth) row of conductive contacts 235 (adjacent to the third row) from right to left and then "turns" again and passes over the next (fifth) row of conductive contacts 235 at the bottom of FIG. 3A (adjacent to the fourth row) from left to right.

The trench 350 may bifurcate each plane of the conductive material 245 into at least two portions: a first portion 308 and a second portion 309. Each portion of a plane of the conductive material 245 may be a different access line (e.g., even word line or odd word line) of a deck. For example, the first portion 308 may be a first access line of a deck of the 3D memory array 200-c and the second portion 309 may be a second access line of the same deck of the 3D memory array 200-c. The extension of the fingers forming the even or odd planes may be defined based on the resistivity of an electrode used and by the level of current delivery requested. Specifically, the depth of the recesses is defined depending on the thickness desired for the memory cell.

FIG. 3B illustrates forming a plurality of recesses 315 in the conductive material 245 in each of the planes of memory array 200-d. For example, a selective etching operation may be performed to form the plurality of recesses 315 in sidewalls 390 and 391 of the trench 350 in an isotropic way. In some examples, the trench 350 includes a first sidewall 390 spaced apart from a second sidewall 391, where a first portion 392 of the first sidewall 390 formed by the first insulative material 240 is spaced apart from a first portion 393 of the second sidewall 391 formed by the first insulative material 240 by a first distance. A second portion 394 of the first sidewall 390 formed by the first conductive material 245 may be spaced apart from a second portion 396 of the second sidewall 391 formed by the first conductive material 245 by a second distance greater than the first distance. In some examples, portions of sidewalls 390 and 391 of the trench 350 formed by the first conductive material 245 are recessed relative to portions of the sidewalls 390 and 391 of the trench 350 formed by the first insulative material 240.

The etching operations may include one or more vertical etching processes (e.g., an anisotropic etching process or a dry etching process, or a combination thereof) or horizontal etching processes (e.g., an isotropic etching process) or combinations thereof. For example, a vertical etching process may be performed to vertically etch the trench 350 and a horizontal etching process may be used to form at least one recess 315 in at least one conductive material 245. The etching parameters may be selected such that the conductive material 245, for example, is etched faster than the second insulative material 240.

FIG. 3C illustrates forming a conformal material 320 (e.g., a sacrificial material or sacrificial layer). The conformal material 320 may be deposited into the trench 350 of memory array 200-e. The conformal material 320 may be formed in the recesses 315 (shown in FIG. 3B) by conformally depositing the conformal material 320. The conformal material 320 contacts a first sidewall 390, a second sidewall 391, and a bottom wall 395 of each trench 350. Although FIG. 3C shows the conformal material 320 may be formed on the sidewalls of the trench 350 (e.g., on the surfaces of the second insulative material 240 and the conductive materials 245 in different layers facing into the trench 350) during formation of the conformal material 320 in the plurality of recesses 315, examples are not so limited. For example, the conformal material 320 may be confined to only the plurality of recesses 315 in the conductive materials 245 in different layers in some cases. In some cases, the conformal material 320 may be referred to as a conformal layer or a sacrificial layer. In some cases, the conformal material 320 may be a dielectric material, for example, $SiO_2$, $GeO_2$, $SiN_x$, $WO_3$, or the like. Although, for an illustrative purpose, the conformal material 320 is selected as $SiO_2$, $GeO_2$, $SiN_x$, or $WO_3$, examples are not so limited. Other different material may be possible.

In some cases, an etching operation may be performed subsequent to forming the conformal material 320. In the etching operation, the conformal material 320 may be etched to form an opening or trench 350. The etch operation may result in the surfaces of the conformal material 320 (e.g., the surfaces facing the trench 350) being spaced apart from the surfaces of the second insulative material 240 (e.g., the surfaces facing into the trench 350). In some cases, the etch operation may result in the surfaces of the conformal material 320 (e.g., the surfaces facing the trench 350) being approximately coplanar with surfaces of the second insulative material 240 (e.g., the surfaces facing into the trench 350), and thereby forming a continuous sidewall of trench. The etching operations described herein may be vertical etching processes (e.g., an anisotropic etching process or a dry etching process, or a combination thereof) or horizontal etching processes (e.g., an isotropic etching process).

FIG. 3D illustrates depositing a dielectric material 318 in the trench 350 on top of the conformal material 320 of the memory array 200-f. The dielectric material 318 may contact the conformal material 320. The dielectric material 318 and the conformal material 320 may cooperate to fill the trench 350. In some cases, the dielectric material 318 may be an example of an insulative material. In some examples, the conformal material 320 may be etched back selectively to form a co-planar surface with the dielectric material 318. The depth of the recession may be defined depending on a desired thickness. In some cases, the dielectric material 318 may be $Al_2O_3$, $TiO_2$, $HfO_2$, or the like. However, examples of the dielectric material may not be limited to those mentioned above.

FIG. 3E illustrates a top view of an example 3D memory array 200-f after the dielectric material 318 is deposited (as shown in FIG. 3D), in accordance with an example of the present disclosure. In FIG. 3E, the conformal material 320 formed in the trench 350 and the dielectric material 318 bifurcates each plane of the conductive material 245 into a first portion 308 and a second portion 309.

FIGS. 4A-4F illustrate various views of example 3D memory arrays 200-g, 200-h, 200-i, 200-j, and 200-k, during a series of steps or processes that may be performed to form a stacked memory device, in accordance with examples as disclosed herein. Specifically, FIGS. 4A-4F illustrate processes for forming memory cells in the memory array 200-f illustrated in FIGS. 3D and 3E.

Figure 4A:
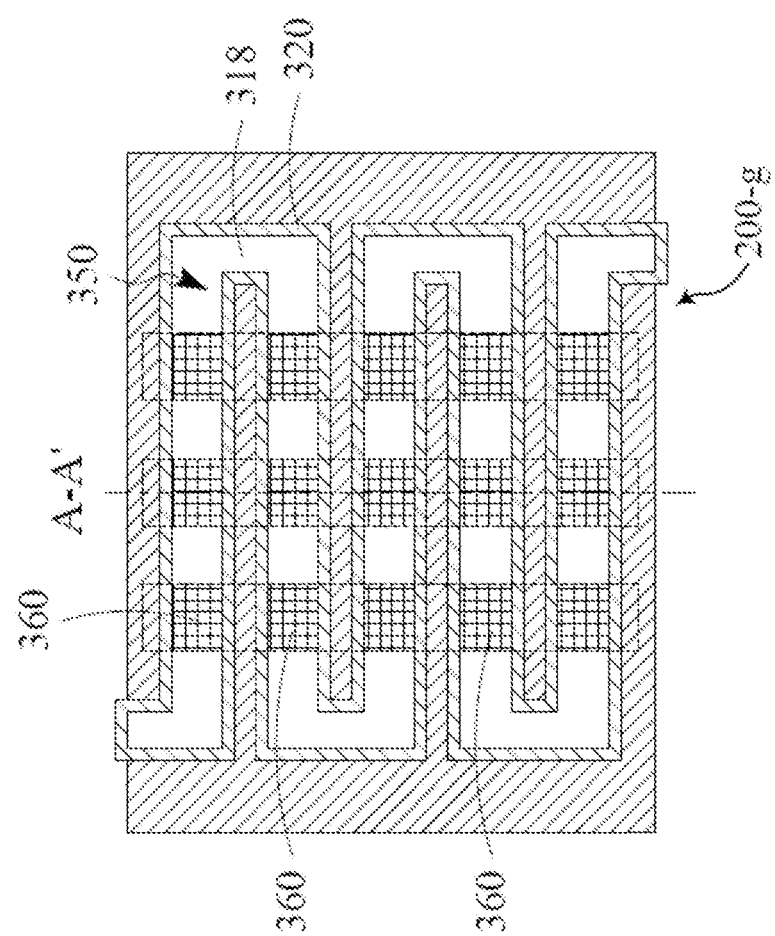
FIGS. 4A through 4F illustrate various views of example 3D memory array in accordance with examples as disclosed herein.
Figure 4B:
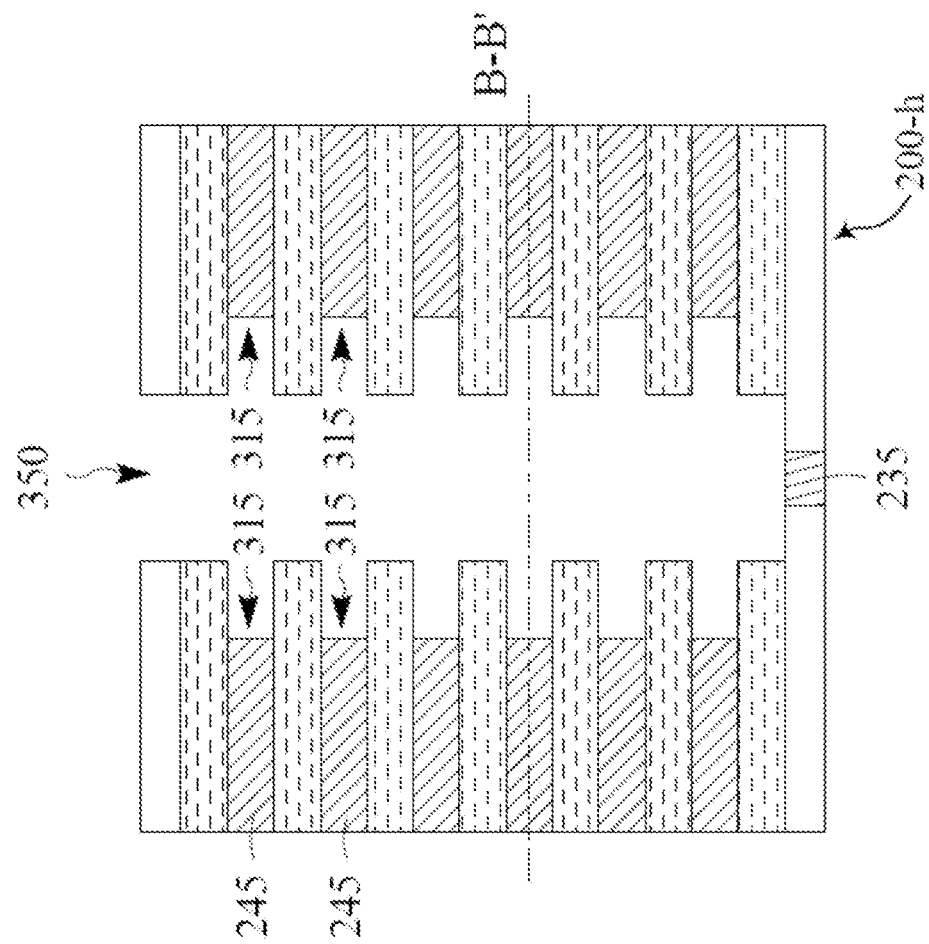
Figure 4C:
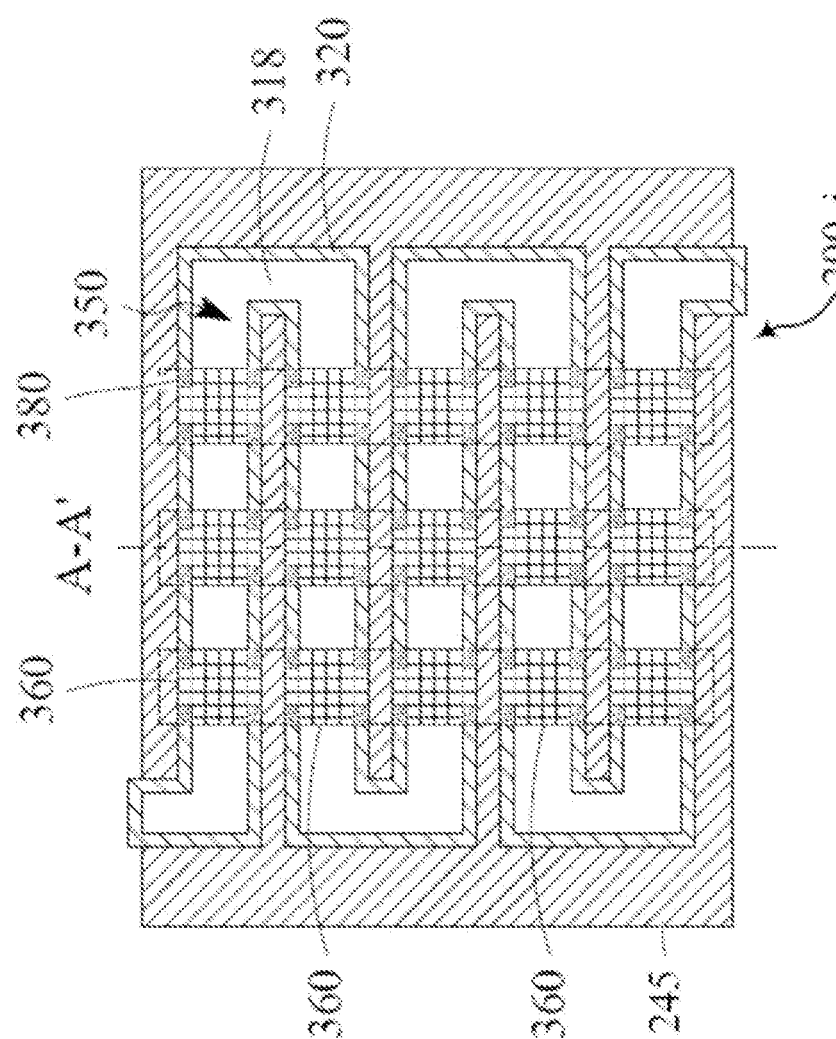
Figure 4D:
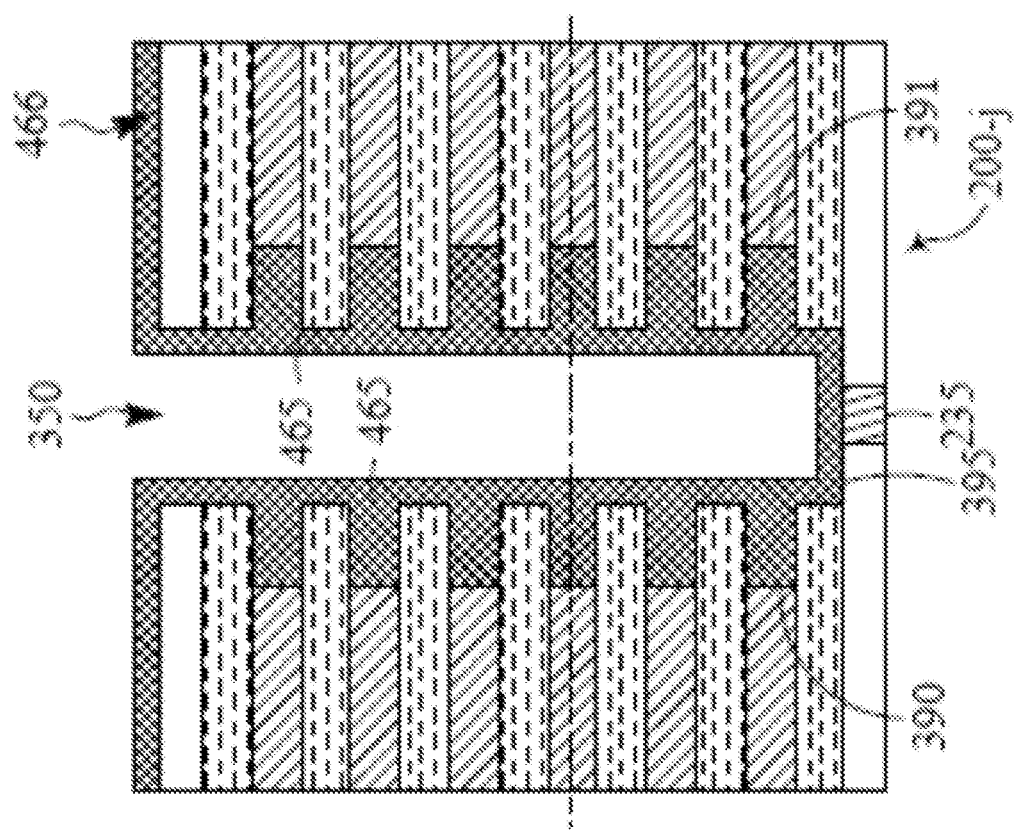
Figure 4E:
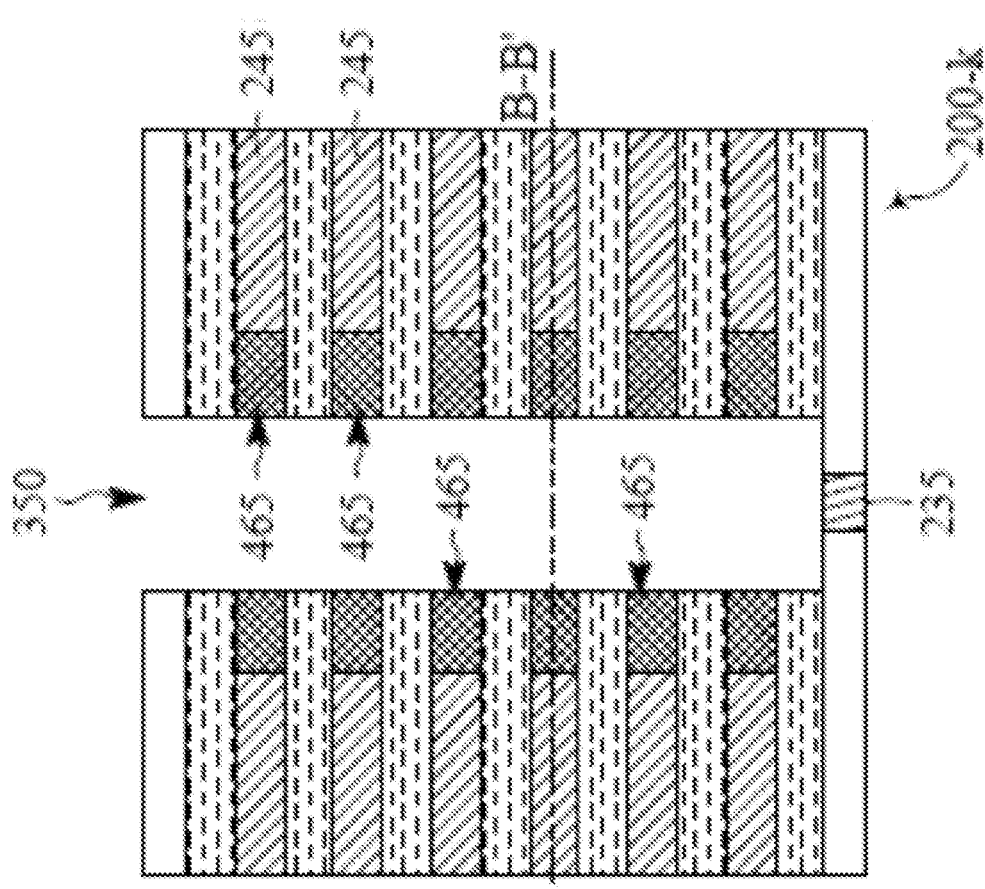
Figure 4F:
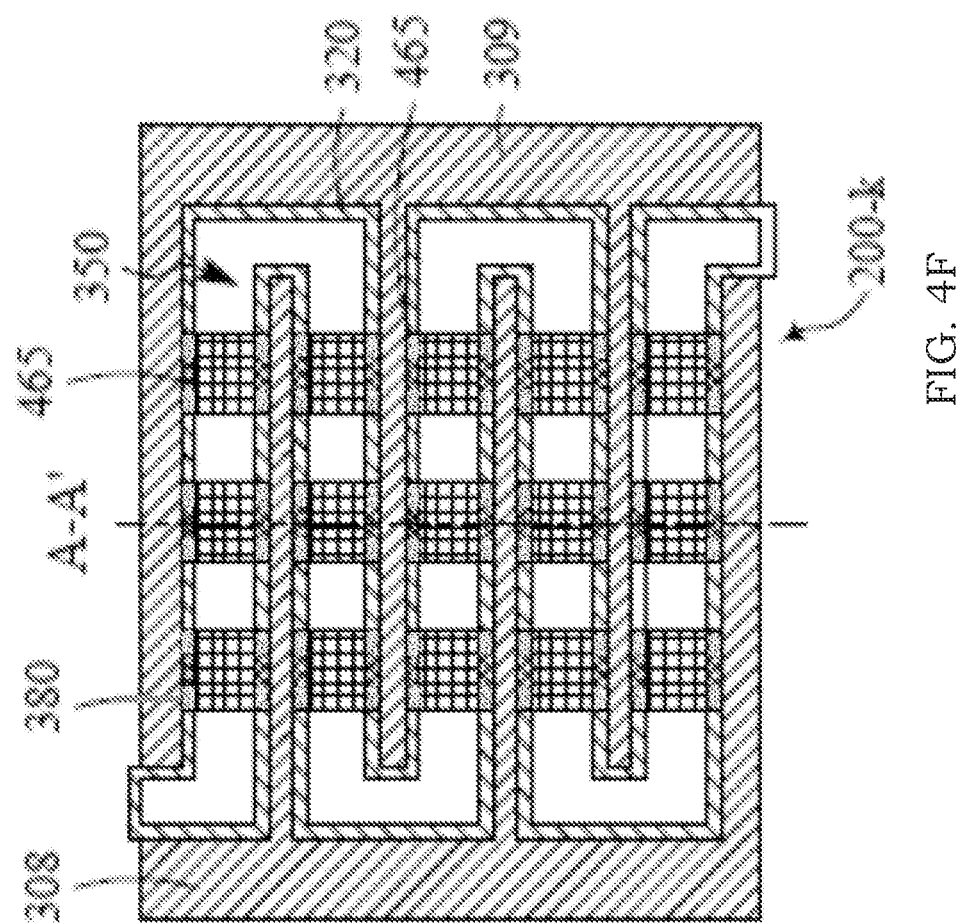

FIG. 4A illustrates a top view of a memory array 200-g, which may be an example of the memory array 200-f illustrated in FIG. 3E after formation of openings 360. FIG. 4B illustrates a cross-sectional view of an example 3D memory array 200-h along section line A-A' during a process step subsequent to what is illustrated in FIG. 4A. FIG. 4C illustrates a top view of the example 3D memory array 200-i of section line B-B' during a process step subsequent to what is illustrated in FIG. 4B. FIG. 4D illustrates a cross-sectional view of an example 3D memory array 200-j along section line A-A' during a process step subsequent to what is illustrated in FIG. 4C. FIG. 4E illustrates a cross-sectional view of an example 3D memory array 200-k along section line A-A' during a process step subsequent to what is illustrated in FIG. 4D. FIG. 4F illustrates a top view of the example 3D memory array 200-k of section line B-B' during a process step subsequent to what is illustrated in FIG. 4D.

FIG. 4A illustrates a top view through any one of the planes of the conductive material 245 of the memory array 200-g. A plurality of openings 360 in a trench 350 may be formed by etching away a portion of the dielectric material 318 and/or the conformal material 320. The openings 360 are intended to be positioned in alignment with the plurality of contacts 235 so that forming the openings 360 exposes at least a portion of a plurality of contacts 235 (shown in FIG. 4B) extending through the substrate 104 (shown in FIG. 4B). The etching process may be a vertical etching process. In some examples, the etching operation may not etch away all portions of the conformal material 320, for example, where the plurality of openings 360 are not formed.

FIG. 4B illustrates a cross-sectional view of an example 3D memory array 200-$h$ in accordance with an example of the present disclosure. As shown in FIG. 4B, a plurality of recesses 315 may be formed in the conductive material 245 in each of the planes. For example, a selective etching operation may be performed to form the plurality of recesses 315 in a full or partially isotropic way. The etching chemistry may be selected to selectively reach a conductive material 245. The contacts 235 may be exposed by forming the openings 360 in the trench 350.

FIG. 4C illustrates a top view of an example 3D memory array 200-$i$ in accordance with an example of the present disclosure. As shown in FIG. 4C, a plurality of spacers 380 may be formed, for instance, in the recess 315 (shown in FIG. 4B), on the walls of the conformal material 320 exposed by the etching operation for forming the openings 360. In some cases, as shown in FIG. 4C, there may be a further recess smaller than the recess 315 formed between respective two spacers, which may be used to form a storage element material 465 described below. In some cases, the spacers 380 may be formed by an area-selective atomic layer deposition (ALD). By employing the area-selective ALD, the spacers 380 may be formed, or grown, only on the walls of the conformal material 320 instead of the dielectric material 318. In some cases, an example of the material of the spacers 380 may be a dielectric material such as $SiO_2$. However, examples may not be so limited.

In some cases, in order to allow the selective deposition of the spacers 380 material on the conformal material 320, the area-selective ALD may be selected which consists of acetylacetone as an inhibitor, bis(diethylamino)silane (BDEAS) as a Si precursor, and $O_2$ plasma as a co-reactant. In some cases, the conformal material 320 may be selected as $SiO_2$, $GeO_2$, $SiN_x$, or $WO_3$, while the dielectric material 310 may be selected as $Al_2O_3$, $TiO_2$, or $HfO_2$, in order to make sure that the spacers 380 (e.g., $SiO_2$) grows only on the walls of the conformal material 320 but not on the walls of the dielectric material 318. In some cases, the conformal material 320 and the dielectric material 318 may be selected as other different materials to one another, as long as the spacers 380 can only grow on the walls of the conformal material 320.

In some cases, as shown in FIG. 4C, the growth of the spacers 380 may start at the walls of the conformal material 320 and keep going along sidewalls of the conductive material 245 exposed in the openings 360. In some cases, the growth of the spacers 380 may stop when a desired thickness of the spacers 380 is formed. In some cases, the thickness of the spacers 380 may depend on a desired size of the active area of the memory cell.

FIG. 4D illustrates a cross-sectional view of an example 3D memory array 200-$j$ in accordance with an example of the present disclosure. As shown in FIG. 4D, a storage element material 465 may be formed in the plurality of recesses 315 by conformally depositing the storage element material 465 into the trench 350. The storage element material 465 may be deposited to contact sidewalls 390 and 391 and a bottom wall 395 of the trench 350 exposed by the etching of the conformal material 320. When the storage element material 465 contacts the bottom wall 395 of the trench 350, the storage element material 465 covers the exposed contacts 235. In some cases, the storage element material 465 may further contact sidewalls of the spacers 380 (not shown in FIG. 4D) exposed in the trench 350. In some cases, a portion of the storage element material 465 may be positioned between respective two spacers 380.

The storage element material 465 may be an example of a chalcogenide material, such as a chalcogenide alloy and/or glass, that may serve as a self-selecting storage element material (e.g., a material that may serve as both a select device and a storage element). For example, the storage element material 465 may be responsive to an applied voltage, such as a program pulse. For an applied voltage that is less than a threshold voltage, the storage element material 465 may remain in an electrically nonconductive state (e.g., an "off" state). Alternatively, responsive to an applied voltage that is greater than the threshold voltage, the storage element material 465 may enter an electrically conductive state (e.g., an "on" state).

The storage element material 465 may be programmed to a target state by applying a pulse (e.g., a programming pulse) that satisfies a programming threshold. The amplitude, shape, or other characteristics of the programming pulse may be configured to cause the storage element material 465 to exhibit the target state. For example, after applying the programming pulse, the ions of the storage element material 465 may be redistributed throughout the storage element, thereby altering a resistance of the memory cell detected when a read pulse is applied. In some cases, the threshold voltage of the storage element material 465 may vary based on applying the programming pulse.

The state stored by the storage element material 465 may be sensed, detected, or read by applying read pulse to the storage element material 465. The amplitude, shape, or other characteristics of the read pulse may be configured to allow a sense component to determine what state is stored on the storage element material 465. For example, in some cases, the amplitude of the read pulse is configured to be at a level that the storage element material 465 will be in an "on" state (e.g., current is conducted through the material) for a first state but will be in an "off" state (e.g., little to no current is conducted through the material) for a second state.

In some cases, the polarity of the pulse (whether programming or read) applied to the storage element material 465 may affect the outcomes of the operation being performed. For example, if the storage element material 465 stores a first state, a read pulse of a first polarity may result in the storage element material 465 exhibiting an "on" state while a read pulse of a second polarity may result in the storage element material 465 exhibiting an "off" state. This may occur because of the asymmetrical distributions of ions or other material in the storage element material 465 when it is storing a state. Similar principles apply to programming pulses and other pulses or voltages.

Examples of chalcogenide materials that may serve as the storage element material 465 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_5$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. Other examples of chalcogenide materials may include tellurium-arsenic (As)-germanium (OTS) materials, Ge, Sb, Te, silicon (Si), nickel (Ni), gallium (Ga), As, silver (Ag), tin (Sn), gold (Au), lead (Pb), bismuth (Bi), indium (In), selenium (Se), oxygen (O), Sulphur (S), nitrogen (N), carbon (C), yttrium (Y), and scandium (Sc) materials, and combinations thereof. The hyphenated chemical composition notation, as used herein, indicates the elements included in a particular mixture or compound, and is intended to represent all stoichiometries involving the indicated elements. In some examples, the chalcogenide material may be a chalcogenide glass or amorphous chalcogenide material. In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms. In some examples, conductivity may be controlled through doping using various chemical species. For example, doping may include incorporating a Group 3 (e.g., boron (B), gallium (Ga), indium (In), aluminum (Al), etc.) or Group 4 (tin (Sn), carbon (C), silicon (Si), etc.) element into the composition.

FIG. 4E illustrates a cross-sectional view of an example 3D memory array 200-$k$ in accordance with an example of the present disclosure. An etching operation may be performed subsequent to forming the storage element material 465 so that surfaces of the storage element material 465 (e.g., the surfaces facing into the trench 350) is approximately coplanar with surfaces of the second insulative material 240 (e.g., the surfaces facing into the trench 350) as illustrated in FIG. 4D. The etching of the storage element material 465 may form a continuous sidewall and remove the top layer 466 (shown in FIG. 4C) of the storage element material 465, whereby cells of the storage element material 465 are formed in the recesses only. In each recess, each cell of the storage element material 465 may contact a single conductive material 245 (e.g., a single conductive material 245 located adjacent to the cell of the storage element material 465) and at least two dielectric layers (e.g. a top dielectric layer and a bottom dielectric layer located on top of the cell of the storage element material 465 and on bottom of the cell of the storage element material 465), as shown in FIG. 4D. The etching of the storage element material 465 may provide a configuration in which the storage element material 465 are separated from one another. The etching of the storage element material 465 may also expose the contacts 235 in the substrate 104. In some examples, spacers 380 may be located on either side of the cell of the storage element material 465 (as shown in FIG. 4F).

FIG. 4F illustrates a top view of an example 3D memory array 200-$k$ in accordance with an example of the present disclosure. As illustrated in FIG. 4F, the conformal material 320, the spacers 380, and the storage element material 465 formed in the trench 350 may bifurcate each plane of the conductive material 245 into a first portion 308 and a second portion 309. Each portion of a plane may be an example of a word line plate.

Figure 5A:
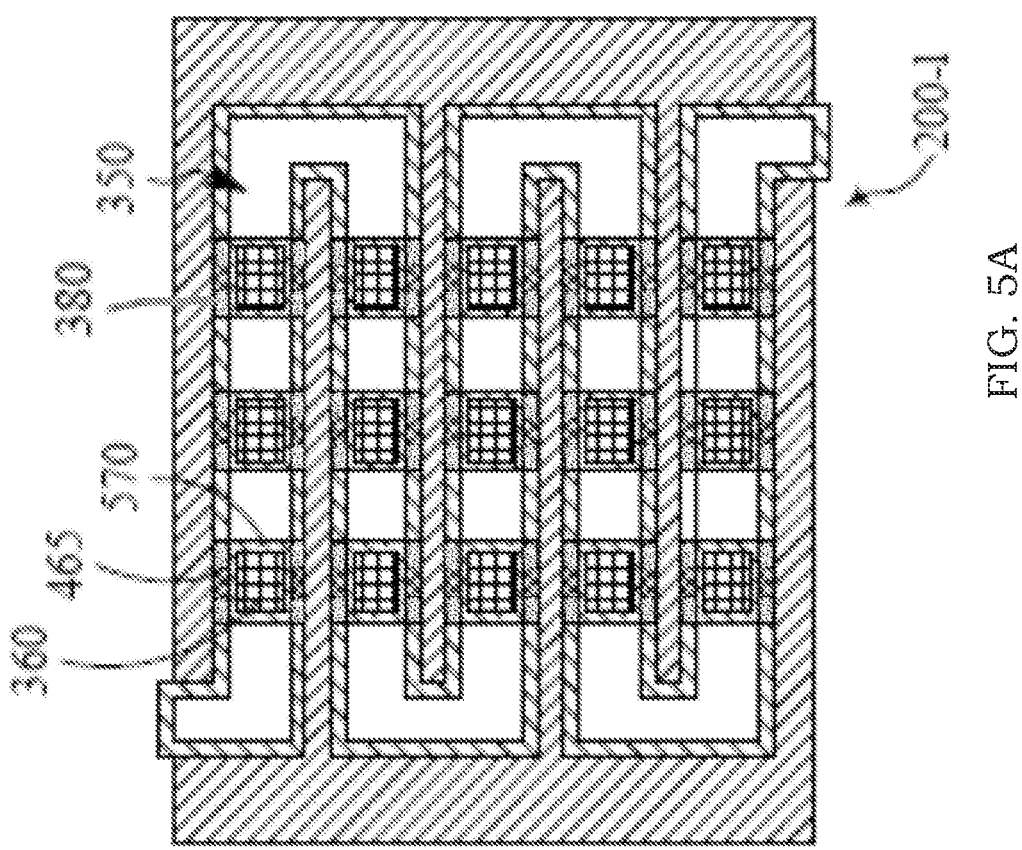
FIGS. 5A through 5C illustrate various views of example 3D memory arrays in accordance with examples as disclosed herein.
Figure 5B:
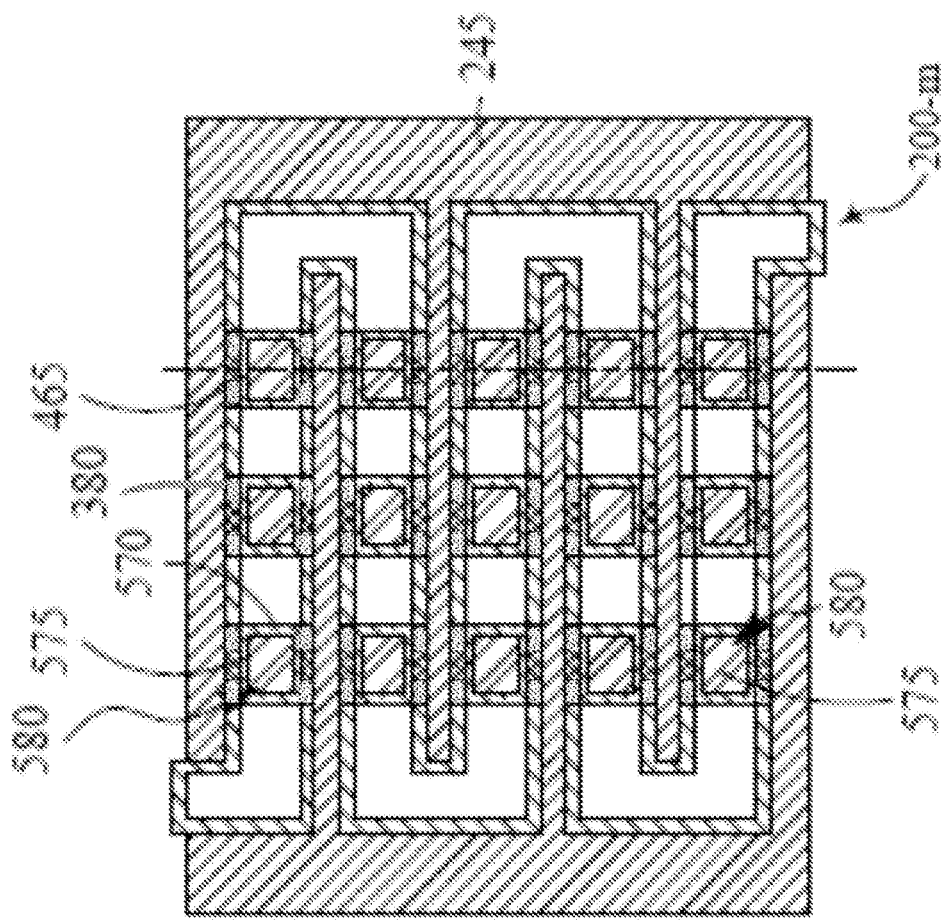
Figure 5C:
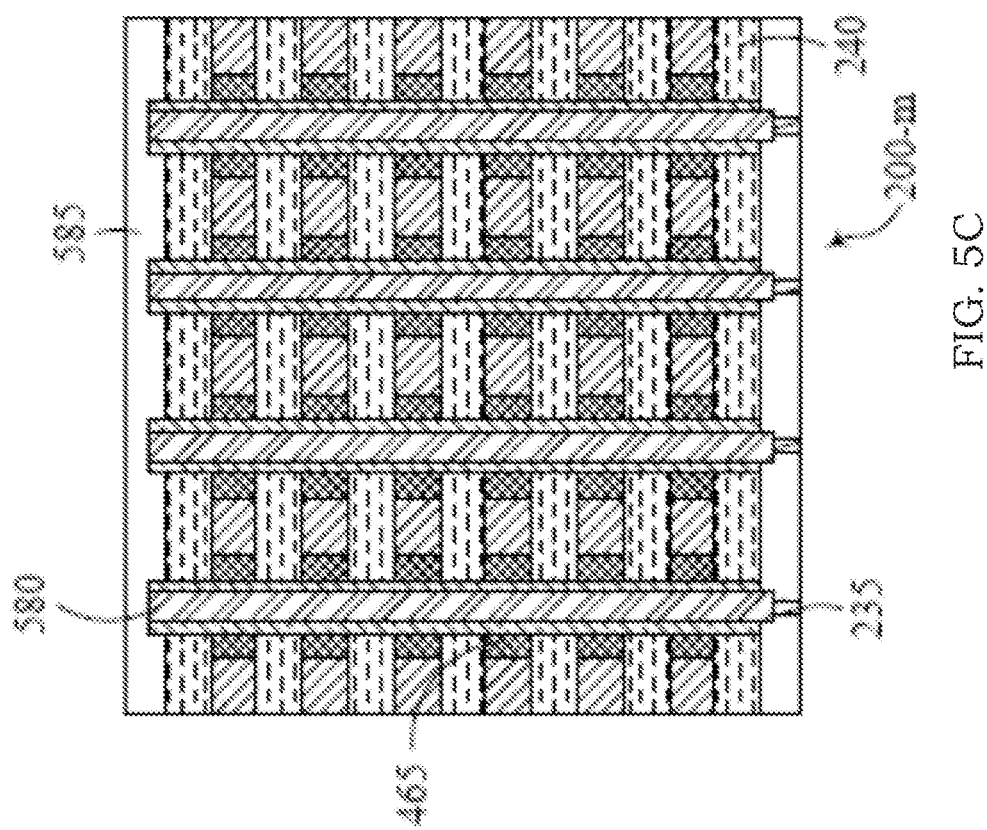

FIGS. 5A-5C illustrate various views of example 3D memory arrays 200-$l$ and 200-$m$, during a series of steps or processes that may be performed to form a stacked memory device, in accordance with examples as disclosed herein. Specifically, FIGS. 5A-5C illustrate processes of filling the openings 360 after the recessed self-selecting memory cells are formed.

FIG. 5A illustrates a top view of a memory array 200-$l$, which may be an example of the memory array 200-$k$ illustrated in FIG. 4F after formation of recessed self-selecting memory cells. FIG. 5B is a top view of a memory array 200-$m$ through any one of the planes of the conductive material 245 illustrated in FIG. 4E during a processing step that is subsequent to what is illustrated in FIG. 5A. FIG. 5C illustrates a cross-sectional view of an example 3D memory array 200-$m$ along section line A-A' during a processing step that is subsequent to what is illustrated in FIG. 5B.

FIG. 5A illustrates a top view of a memory array 200-$l$ where a barrier material 570 is deposited into the openings 360 of the trench 350. In some implementations, the barrier material 570 contacts at least one portion of the first insulative material 240 (not shown), the second insulative material 240 (not shown), the spacers 380, and the storage element material 465. In some examples, the barrier material 570 is compatible with an active material. In some examples, the barrier material 570 may be a conductive material, or a barrier layer with a conductive material. The barrier layer may comprise aluminum oxide, for example. In some examples, an etching operation may be performed to make room for conductive material to be deposited into the trench 350. In some cases, the barrier material 570 may be referred to as a barrier layer.

FIG. 5B illustrates a top view of a memory array 200-$m$ where a conductive material 575 is deposited into the openings 360 of the trench 350. A conductive material 575 may deposited in the opening 360 to form a conductive pillar 580. The conductive pillar 580 may include the barrier material 570 and the conductive material 575. In some examples, the conductive pillar 580 may be formed in contact with the storage element material 465 on the sidewalls 390 and 391 (shown in FIG. 4D) of the trench 350 and in contact with the spacers 380 as shown in FIG. 5B. In some examples, the conductive pillar 580 may comprise the same material as the conductive material 575. In some examples, the conductive pillar 580 may be a digit line. The conductive pillar 580 may be a cylinder. Although FIG. 5B illustrates the conductive pillar 580 as a solid pillar, in some examples the conductive pillar 580 may be a hollow cylinder or toroidal (e.g., a tube). The conductive pillar 580 may comprise a metallic (or semi-metallic) material or a semiconductor material such as a doped polysilicon material, among others. However, other metallic, semi-metallic, or semiconductor materials may be used.

The conductive pillar 580 formed in each respective one of the plurality of openings 360 are arranged to extend substantially orthogonal to the alternating planes of the conductive material 245 and the second insulative material 240 (not shown). The spacers 380, the storage element material 465, and the conductive pillar 580 formed in each respective one of the plurality of openings 360 are formed in a substantially square shape. However, examples of the present disclosure are not limited to exact or quasi-exact square shapes. For instance, the spacers 380, the storage element material 465, and the conductive pillar 580 may formed in any shape, including circles or oval shapes, for instance.

FIG. 5C illustrates a side view of an example 3D memory array 200-$m$ in accordance with an example of the present disclosure. As illustrated in FIG. 5C, a capping layer 585 (e.g., an insulative material, such as a dielectric layer) may be deposited to cap the conductive pillars 580 of memory array 200-$m$.

The memory array 200-$m$ may include a plurality of vertical stacks. Each respective stack may include the conductive pillar 580, a conductive contact 235 coupled to the conductive pillar 580, the storage element material 465 formed in contact with the first portion 308 and the conductive pillar 580, and the storage element material 465 formed in contact with the second portion 309 and the conductive pillar 580.

The conductive pillar 580 may be in contact with the conductive contact 235 and the first insulative material 240, and in contact with the storage element material 465 and the spacers 380 (not shown in FIG. 5C) formed in the recesses 315. In some cases, the storage element material 465 is formed partially (e.g., not completely) around the conductive pillar 580.

Although not shown in FIG. 5C for clarity and so as not to obscure examples of the present disclosure, other materials may be formed before, after, and/or between the storage element material 465, and/or the conductive pillar 580, for example, to form adhesion layers or barriers against interdiffusion of materials and/or to mitigate composition mixing.

Figure 6:
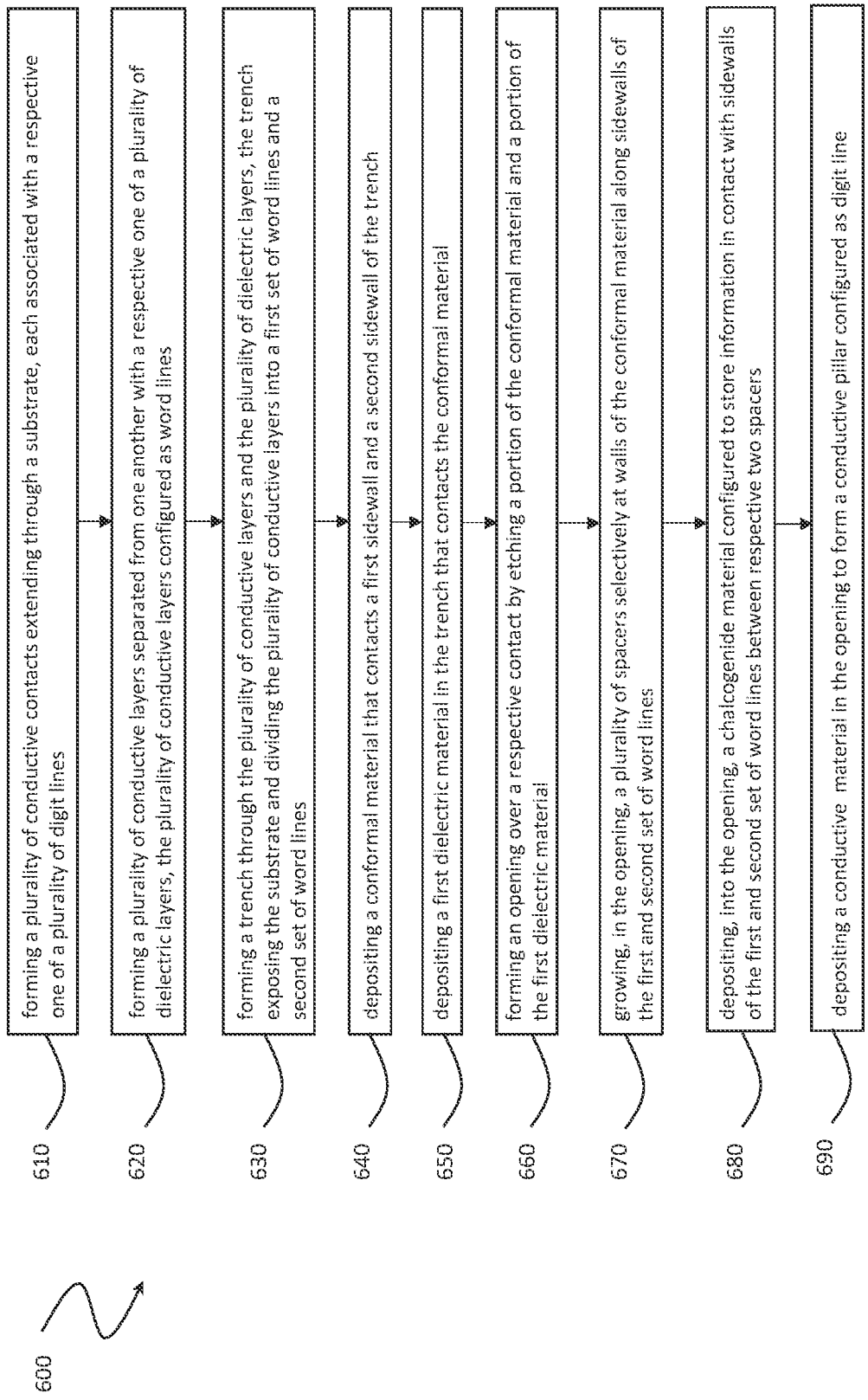
FIG. 6 shows a flowchart illustrating a method of manufacturing a 3D memory array in accordance with examples as disclosed herein.

FIG. 6 shows a flowchart illustrating a method 600 for manufacturing a 3D memory array in accordance with aspects of the present disclosure. The operations of method 600 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At S610, the method 600 may include forming a plurality of conductive contacts extending through a substrate, each associated with a respective one of a plurality of digit lines. The operations of S610 may be performed according to the method described herein.

At S620, the method 600 may include forming a plurality of conductive layers separated from one another with a respective one of a plurality of dielectric layers, the plurality of conductive layers configured as word lines. The operations of S620 may be performed according to the method described herein.

At S630, the method 600 may include forming a trench through the plurality of conductive layers and the plurality of dielectric layers, the trench exposing the substrate and dividing the plurality of conductive layers into a first set of word lines and a second set of word lines. The operations of S630 may be performed according to the method described herein.

At S640, the method 600 may include depositing a conformal material that contacts a first sidewall and a second sidewall of the trench. The operations of S640 may be performed according to the method described herein.

At S650, the method 600 may include depositing a first dielectric material in the trench that contacts the conformal material. The operations of S650 may be performed according to the method described herein.

At S660, the method 600 may include forming an opening over a respective contact by etching a portion of the conformal material and a portion of the first dielectric material. The operations of S660 may be performed according to the method described herein.

At S670, the method 600 may include forming, e.g., growing, in the opening, a plurality of spacers selectively at walls of the conformal material along sidewalls of the first and second set of word lines. The operations of S670 may be performed according to the method described herein.

At S680, the method 600 may include depositing, into the opening, a chalcogenide material configured to store information in contact with sidewalls of the first and second set of word lines between respective two spacers. The operations of S680 may be performed according to the method described herein.

If we summarize the core steps of the method of the present disclosure we could say that when the main 3D vertical structure of the memory array has been formed as a stack of alternate conductive and dielectric layers, the method proceeds with the formation of a trench through the plurality of conductive layers and the plurality of dielectric layers of the 3D memory array structure.

The trench exposes the substrate and divides the plurality of conductive layers into a first set of word lines and a second set of word lines.

In the opening formed by the trench a plurality of spacers is formed, or grown, contacting at least the first and second set of word lines thus reducing the opening size.

Each of the plurality of spacers is only positioned at a respective corner wall between the word lines and a conformal material exposed by the trench forming.

The interspace between the spacers is then filled along the word lines with a chalcogenide material.

Finally, at S690, the method 600 may include depositing a conductive material in the opening to form a conductive pillar configured as digit line.

It should be remarked that, in some examples, the spacers growth, or formation, is obtained through an area-selective atomic layer deposition (ALD), in a similar fashion as previously described with reference to FIG. 4C, for example.

Additionally or alternatively, the method 600 for manufacturing a 3D memory array may further comprise etching a portion of the chalcogenide material to form a continuous sidewall of the opening, and depositing a barrier material into the opening that contacts the continuous sidewall of the opening. In some examples, the chalcogenide material may comprise a first wall contacting a respective one of the plurality of conductive layers, a second wall contacting a respective one of the plurality of dielectric layers, a third wall contacting a further respective one of the plurality of dielectric layers, a fourth wall contacting the barrier material, a fifth wall contacting a respective spacer, and a sixth wall contacting a further respective spacer.

Additionally or alternatively, the method 600 for manufacturing a 3D memory array may further comprise etching the barrier material to expose the contact, and depositing a conductive material into the opening that contacts the barrier material and the contact. In some examples, the conductive material may be configured as a digit line.

In some examples, the step of forming the trench may comprise performing a vertical etching process to vertically etch the trench, and performing a horizontal etching process after the vertical etching process to form at least one recess in the conductive layer. In some examples, the vertical etching process may comprise an anisotropic etching process or a dry etching process or a combination thereof. In some examples, the horizontal etching process may comprise an isotropic etching process.

In some examples, the step of forming the trench may expose at least a portion of the plurality of contacts extending through the substrate.

In some examples, the trench may extend through the plurality of conductive layer and the plurality of dielectric layers in a serpentine shape. In some examples, the trench may comprise the first sidewall spaced apart from the second sidewall, wherein a first portion of the first sidewall formed by the dielectric layers is spaced apart from a first portion of the second sidewall formed by the dielectric layers by a first distance, and a second portion of the first sidewall formed by the plurality of conductive layers is spaced apart from a second portion of the second sidewall formed by the plurality of conductive layers by a second distance greater than the first distance.

In some examples, portions of the sidewalls of the trench formed by the plurality of conductive layers may be recessed relative to portions of the sidewalls of the trench formed by the dielectric layers.

In some examples, each of the plurality of spacers may be only positioned at a respective wall of the conformal material. In some examples, each of the plurality of spacers may grow only at the respective wall of the conformal material through an area-selective atomic layer deposition (ALD), in a similar fashion as previously described with reference to FIG. 4C, for example. In some examples, each of the plurality of spacers may consist of a dielectric material.

In some examples, the conformal material may be a second dielectric material different from the first dielectric material such that a spacer may be formed, or grow, only on the wall of the conformal material through an area-selective atomic layer deposition (ALD).

In some examples, an apparatus as described herein may perform a method, such as the method 600. The apparatus may include features, means, or instructions (e.g., a non-transitory computer-readable medium storing instructions executable by a processor) for forming a plurality of conductive contacts extending through a substrate, each associated with a respective one of a plurality of digit lines.

Some examples of the apparatus described herein may further include operations, features, means, or instructions for forming a plurality of conductive layers separated from one another with a respective one of a plurality of dielectric layers, the plurality of conductive layers configured as word lines.

Some examples of the apparatus described herein may further include operations, features, means, or instructions for forming a trench through the plurality of conductive layers and the plurality of dielectric layers, the trench exposing the substrate and dividing the plurality of conductive layers into a first set of word lines and a second set of word lines.

Some examples of the apparatus described herein may further include operations, features, means, or instructions for depositing a conformal material that contacts a first sidewall and a second sidewall of the trench.

Some examples of the apparatus described herein may further include operations, features, means, or instructions for depositing a first dielectric material in the trench that contacts the conformal material.

Some examples of the apparatus described herein may further include operations, features, means, or instructions for forming an opening over a respective contact by etching a portion of the conformal material and a portion of the first dielectric material.

Some examples of the apparatus described herein may further include operations, features, means, or instructions for forming, or growing, in the opening, a plurality of spacers selectively at walls of the conformal material along sidewalls of the first and second set of word lines.

Some examples of the apparatus described herein may further include operations, features, means, or instructions for depositing, into the opening, a chalcogenide material configured to store information in contact with sidewalls of the first and second set of word lines between respective two spacers.

Some examples of the apparatus described herein may further include operations, features, means, or instructions for etching a portion of the chalcogenide material to form a continuous sidewall of the opening, depositing a barrier material into the opening that contacts the continuous sidewall of the opening, etching the barrier material to expose the contact, and depositing a conductive material into the opening that contacts the barrier material and the contact.

Some examples of the apparatus described herein may further include operations, features, means, or instructions for depositing a conductive material in the opening to form a conductive pillar configured as digit line.

In some examples of the method 600 and the apparatus described herein, each of the set of spacers is only positioned at a respective wall of the conformal material. In some examples of the method 600 and the apparatus described herein, each of the plurality of spacers is formed only at the respective wall of the conformal material through an ALD. In some examples of the method 600 and the apparatus described herein, the ALD comprises acetylacetone as an inhibitor, BDEAS as a Si precursor, and $O_2$ plasma as a co-reactant.

Some examples of the method 600 and the apparatus described herein may further include operations, features, means, or instructions for etching a portion of the chalcogenide material to form a continuous sidewall of the opening, and depositing a barrier material into the opening that contacts the continuous sidewall of the opening.

In some examples of the method 600 and the apparatus described herein, the chalcogenide material includes a first wall contacting a respective one of the plurality of conductive layers, a second wall contacting a respective one of the plurality of dielectric layers, a third wall contacting a further respective one of the plurality of dielectric layers, a fourth wall contacting the barrier material, a fifth wall contacting a respective spacer, and a sixth wall contacting a further respective spacer.

Some examples of the method 600 and the apparatus described herein may further include operations, features, means, or instructions for etching the barrier material to expose the contact, and depositing a second conductive material into the opening that contacts the barrier material and the contact.

In some examples of the method 600 and the apparatus described herein, forming the trench may further include operations, features, means, or instructions for performing a vertical etching process to vertically etch the trench, and performing a horizontal etching process after the vertical etching process to form at least one recess in the plurality of conductive layers.

In some examples of the method 600 and the apparatus described herein, the vertical etching process includes an anisotropic etching process or a dry etching process or a combination thereof.

In some examples of the method 600 and the apparatus described herein, the trench includes the first sidewall spaced apart from the second sidewall, where a first portion of the first sidewall formed by the plurality of dielectric layers is spaced apart from a first portion of the second sidewall formed by the plurality of dielectric layers by a first distance, and a second portion of the first sidewall formed by the plurality of conductive layers is spaced apart from a second portion of the second sidewall formed by the plurality of conductive layers by a second distance greater than the first distance.

In some examples, an apparatus as described herein may perform a method, such as a method of manufacturing a vertical 3D memory array. The apparatus may include features, means, or instructions (e.g., a non-transitory computer-readable medium storing instructions executable by a processor) for forming a trench through a plurality of conductive layers and a plurality of dielectric layers of the 3D memory array, the trench exposing a substrate and dividing the plurality of conductive layers into a first set of word lines and a second set of word lines, forming in an opening in the trench a plurality of spacers contacting at least the first and second set of word lines thus reducing a size of the opening, filling the an interspace between the plurality of spacers along the first and second set of word lines with a chalcogenide material, and depositing a conductive material in the opening.

In some examples of the method and the apparatus described herein, each of the plurality of spacers may only be positioned at a respective corner wall between the word lines and a conformal material exposed by the forming the opening.

In some examples of the method and the apparatus described herein, forming the plurality of spacers includes an area-selective ALD.

In some examples of the method and the apparatus described herein, each of the plurality of spacers is formed only at a respective corner wall of a conformal material based on the area-selective ALD.

In some examples of the method and the apparatus described herein, the area-selective ALD includes acetylacetone as an inhibitor, BDEAS as a Si precursor, and $O_2$ plasma as a co-reactant. In some examples of the method and the apparatus described herein, each of the plurality of spacers consists of a dielectric material. In some examples of the method and the apparatus described herein, each of the plurality of spacers comprises a dielectric material. In some examples of the method and the apparatus described herein, the dielectric material may be selected among a group of: $SiO_2$, $GeO_2$, $SiN_x$, or $WO_3$.

FIG. 7A shows a schematic top or planar view of a generic memory cell 700 wherein the active area is shrinked according to the method of the present disclosure.

After having implemented the reported method steps from 610 to 650 a cavity 710 for realizing the cells active area of the vertical structure and the bit line pillar may be defined. The cavity is formed through an opening over a respective contact by etching a portion of the conformal material 720 and a portion of the first dielectric material 730.

After the cavity 710 definition, that is substantially larger than required otherwise it would not be possible to etch of the entire stack, the selective etching allows removing initially the central dielectric material 730 and then proceeding with the etching of the other dielectric conformal material 720 up to the word lines layers 740e at one side and 740o at the other side.

The schematic view of FIG. 7A may correspond to the situation at the end of the method step 660.

At this point, as reported in step 670 of FIG. 6 and in the schematic example of FIG. 7B, a further dielectric layer 750 is selectively formed, or grown, as a spacer only on the walls of the dielectric conformal layer 720 by means of the area-selective ALD technique. In other words, a spacer material 750 is realized by means of area selective growth in a similar fashion as previously described with reference to FIG. 4C, for example.

In this step inhibitor molecules are selectively adsorbed on the non-growth area (i.e. the word lines areas 740e, 740o and the dielectric areas 730) blocking the precursor adsorption in such a manner that precursor molecules adsorb only on the growth area represented by the conformal dielectric material 720.

The holes 760 left inside the recessed cavity are narrower, for the effect of the spacers 750, with respect to the cavity. At step 680, a chalcogenide material 770 is deposited in the cavity and in particular in the narrow holes 760. The deposited chalcogenide material may be removed, for example with an anisotropic etch, from the cavity sidewalls other than the region adjacent to word lines 740e and 740o between pairs of facing spacers 750. It is noted that this region, being recessed with respect to the cavity 710, is vertically shielded by protruding insulative material 240 (not shown in FIG. 7 because on a different plane parallel to the drawing), that may shield the chalcogenide from the anisotropic etch. Protruding insulative material 240 in respective two dielectric layers may confine the active chalcogenide material 770 in the vertical direction.

The structure may be completed depositing into the central opening a conductive material 780 to form conductive pillar configured as digit line, as described in step 690, for example. Accordingly, in some examples, the chalcogenide material 770 is in contact with a sidewall of a word line 740e and 740o, respective two spacers 750 and digit line conductive pillar 780. In the vertical direction, e.g., out of the plane depicted in FIG. 7, the chalcogenide material may be confined by protruding insulative material 240, e.g., by respective two dielectric layers. In other words, the volume of chalcogenide material 770 for storage and self-selection in the memory cell and the contact area with word lines 740e and 740o are smaller than they would have been in absence of the spacers 750.

Figure 7:
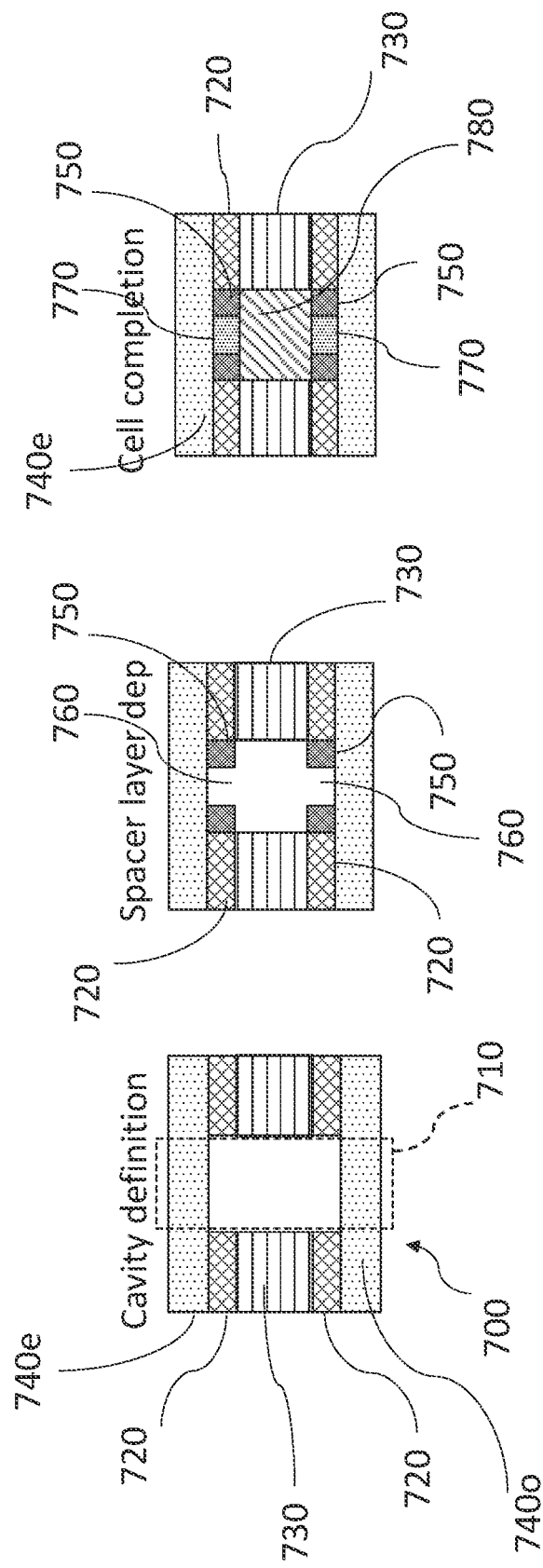
FIGS. 7A, 7B and 7C illustrates various schematic top views of an example of 3D memory cell in accordance with examples as disclosed herein.
Figure 8:
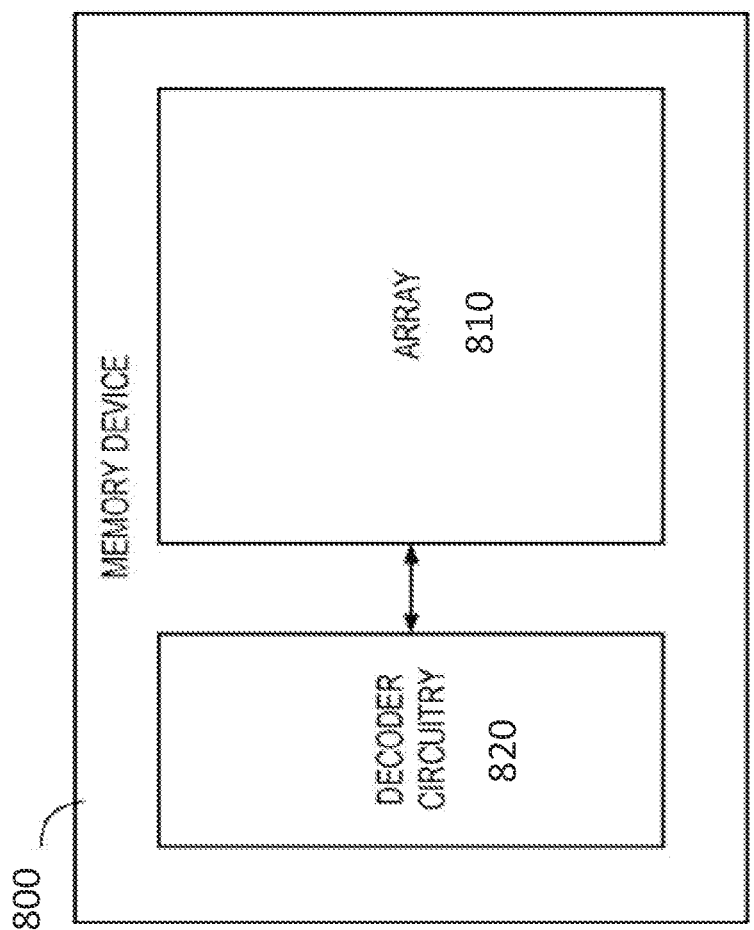
FIG. 8 is a block diagram of an apparatus in the form of a memory device in accordance with examples as disclosed herein.

FIG. 8 is a block diagram of an apparatus in the form of a memory device 800 in accordance with examples as disclosed herein. As used herein, an "apparatus" can refer to, but is not limited to, any of a variety of structures or combinations of structures, such as a circuit or circuitry, a die or dies, a module or modules, a device or devices, or a system or systems, for example. As shown in FIG. 7, the memory device 800 can include a 3D memory array 810. The 3D memory array 810 can be analogous the 3D memory array 200-m previously described in connection with FIG. 5B. Although FIG. 8 shows a single 3D memory array 810 for clarity and so as not to obscure examples of the present disclosure, the memory device 800 may include any number of the 3D memory array 810.

As shown in FIG. 8, the memory device 800 can include decoding circuitry 820 coupled to the 3D memory array 810. The decoding circuitry 820 can be included on the same physical device (e.g., the same die) as the 3D memory array 810. The decoding circuitry 820 can be included on a separate physical device that is communicatively coupled to the physical device that includes the 3D memory array 810.

The decoding circuitry 820 can receive and decode address signals to access the memory cells as mentioned above with reference to FIG. 1 of the 3D memory array 810 during program and/or sense operations performed on the 3D memory array 810. For example, the decoding circuitry 820 can include portions of decoder circuitry for use in selecting a particular memory cell of the 3D memory array 810 to access during a program or sense operation. For instance, a first portion of the decoder circuitry can be used to select a word line and a second portion of the decoder circuitry can be used to select a digit line.

The example illustrated in FIG. 8 can include additional circuitry, logic, and/or components not illustrated so as not to obscure example of the present disclosure. For example, the memory device 800 can include a controller to send commands to perform operation on the 3D memory array 810, such as operations to sense (e.g., read), program (e.g., write), move, and/or erase data, among other operations. Further, the memory device 800 can include address circuitry to latch address signals provided over input/output (I/O) connectors through I/O circuitry. Further, the memory device 800 can include a main memory, such as, for instance, a DRAM or SDRAM, that is separate from and/or in addition to the memory array 810.

A vertical 3D memory device is described. The vertical 3D memory device may include a plurality of contacts associated with a plurality of digit lines and extending through a substrate, a plurality of word line plates separated from one another by respective dielectric layers and including a first plurality of word line plates and a second plurality of word line plates, a first dielectric material positioned between the first plurality and the second plurality of word line plates, the first dielectric material extending in a serpentine shape over the substrate, a conformal material positioned between the first dielectric material and the first and second plurality of word line plates, respectively, a plurality of spacers positioned at respective walls of the conformal material along sidewalls of the first and second plurality of word line plates, a plurality of pillars formed over and coupled with the plurality of contacts, and a plurality of storage elements each comprising chalcogenide material positioned in a recess formed by a respective word line plate, a respective pillar, respective two spacers, and respective two dielectric layers.

In some examples, each of the plurality of spacers is only positioned at a respective wall of the conformal material. In some examples, each of the plurality of spacers formed only at the respective wall of the conformal material through an ALD. In some examples, each of the plurality of spacers consists of a dielectric material. In some examples, each of the plurality of spacers comprises a dielectric material. In some examples, the conformal material is a second dielectric material different from the first dielectric material configured for selective formation of spacers only on the respective walls of the conformal material through an ALD.

In some examples, a pillar of the plurality of pillars further includes a barrier material contacting at least portions of the chalcogenide material and a conductive material contacting the barrier material and configured as a digit line. In some examples, the conformal material may be selected as $SiO_2$, $GeO_2$, $SiN_x$, or $WO_3$, while the first dielectric material may be selected as $Al_2O_3$, $TiO_2$, or $HfO_2$.

In some examples, the plurality of pillars formed over the plurality of contacts interrupts a continuity of the first dielectric material extending over the substrate in the serpentine shape. In some examples, the et of contacts is arranged in a staggered pattern. In some examples, the plurality of contacts is arranged in a grid.

In some examples, the vertical 3D memory device may further include circuitry configured to select a respective word line and a respective digit line during a program operation or sense operation performed on the vertical 3D memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above may be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A vertical 3D memory device, comprising:
   a plurality of contacts extending through a substrate;
   a plurality of word line plates separated from one another by respective dielectric layers and including a first plurality of word line plates and a second plurality of word line plates;
   a first dielectric material positioned between the first plurality of word line plates and the second plurality of word line plates, the first dielectric material extending in a serpentine shape over the substrate;
   a conformal material positioned between the first dielectric material and the first plurality of word line plates and the second plurality of word line plates, respectively, the conformal material extending in a serpentine shape over the substrate in accordance with the first dielectric material;

a plurality of spacers positioned at respective walls of the conformal material and within a plurality of openings along sidewalls of the first plurality of word line plates and the second plurality of word line plates and in accordance with the serpentine shape of the conformal material, each opening including a plurality of the plurality of spacers;

a plurality of pillars formed over and coupled with the plurality of contacts; and a plurality of storage elements each comprising chalcogenide material positioned in a recess formed by a respective word line plate, a respective pillar, respective two spacers, and respective two dielectric layers.

2. The vertical 3D memory device of claim 1, wherein:
each of the plurality of spacers is positioned at a respective wall of the conformal material.

3. The vertical 3D memory device of claim 2, wherein:
each of the plurality of spacers formed at the respective wall of the conformal material through an area-selective atomic layer deposition (ALD).

4. The vertical 3D memory device of claim 1, wherein:
each of the plurality of spacers comprises a dielectric material.

5. The vertical 3D memory device of claim 1, wherein:
the conformal material is a second dielectric material different from the first dielectric material configured for selective formation of spacers only on the respective walls of the conformal material through an area-selective atomic layer deposition (ALD).

6. The vertical 3D memory device of claim 1, wherein:
a pillar of the plurality of pillars further comprises a barrier material contacting at least portions of the chalcogenide material and a conductive material contacting the barrier material and configured as a digit line.

7. The vertical 3D memory device of claim 1, wherein:
the conformal material may be selected as $SiO_2$, $GeO_2$, $SiN_x$, or $WO_3$; and
the first dielectric material may be selected as $Al_2O_3$, $TiO_2$, or $HfO_2$.

8. The vertical 3D memory device of claim 1, wherein:
the plurality of pillars formed over the plurality of contacts interrupts a continuity of the first dielectric material extending over the substrate in the serpentine shape.

9. The vertical 3D memory device of claim 1, wherein:
the plurality of contacts is arranged in a staggered pattern.

10. The vertical 3D memory device of claim 1, wherein:
the plurality of contacts is arranged in a grid.

11. The vertical 3D memory device of claim 1, further comprising:
circuitry configured to select a respective word line and a respective digit line during a program operation or sense operation performed on the vertical 3D memory device.

12. A method of manufacturing a vertical 3D memory array, comprising:
forming a plurality of conductive contacts extending through a substrate, each associated with a respective one of a plurality of digit lines;
forming a plurality of conductive layers separated from one another with a respective one of a plurality of dielectric layers, the plurality of conductive layers configured as word lines;
forming a trench in a serpentine shape through the plurality of conductive layers and the plurality of dielectric layers, the trench exposing the substrate and dividing the plurality of conductive layers into a first set of word lines and a second set of word lines;
depositing a conformal material that contacts a first sidewall and a second sidewall of the trench in accordance with the serpentine shape of the trench;
depositing a first dielectric material different from the conformal material in the trench that contacts the conformal material in accordance with the serpentine shape of the trench and the conformal material;
forming a first opening over a respective contact and a plurality of openings in the trench by etching a portion of the conformal material and a portion of the first dielectric material;
forming, in each of the plurality of openings, a plurality of spacers selectively at walls of the conformal material along sidewalls of the first set of word lines and the second set of word lines in accordance with the serpentine shape of the conformal material;
depositing, into the first opening, a chalcogenide material configured to store information in contact with a sidewall and a bottom wall of a second opening exposed by the etching and between respective two spacers; and
depositing a conductive material in the first opening to form a conductive pillar configured as a digit line.

13. The method of claim 12, wherein:
each of the plurality of spacers is positioned at a respective wall of the conformal material.

14. The method of claim 13, wherein:
each of the plurality of spacers is formed at the respective wall of the conformal material through an area-selective atomic layer deposition (ALD).

15. The method of claim 14, wherein the area-selective atomic layer deposition (ALD) comprises acetylacetone as an inhibitor, bis(diethylamino) silane (BDEAS) as a Si precursor, and $O_2$ plasma as a co-reactant.

16. The method of claim 12, further comprising:
etching a portion of the chalcogenide material to form a continuous sidewall of a third opening; and
depositing a barrier material into the third opening that contacts the continuous sidewall of the third opening.

17. The method of claim 16, wherein:
the chalcogenide material comprises a first wall contacting a respective one of the plurality of conductive layers, a second wall contacting a first further respective one of the plurality of dielectric layers, a third wall contacting a second further respective one of the plurality of dielectric layers, a fourth wall contacting the barrier material, a fifth wall contacting a respective spacer, and a sixth wall contacting a further respective spacer.

18. The method of claim 17, further comprising:
etching the barrier material to expose the contact; and
depositing a second conductive material into a fourth opening that contacts the barrier material and the contact.

19. The method of claim 12, wherein forming the trench comprises:
performing a vertical etching process to vertically etch the trench; and
performing a horizontal etching process after the vertical etching process to form at least one recess in the plurality of conductive layers.

20. The method of claim 19, wherein:
the vertical etching process comprises an anisotropic etching process or a dry etching process or a combination thereof.

21. The method of claim 12, wherein:
the trench comprising the first sidewall spaced apart from the second sidewall, wherein a first portion of the first sidewall formed by the plurality of dielectric layers is spaced apart from a first portion of the second sidewall formed by the plurality of dielectric layers by a first distance, and a second portion of the first sidewall formed by the plurality of conductive layers is spaced apart from a second portion of the second sidewall formed by the plurality of conductive layers by a second distance greater than the first distance.

22. A method of manufacturing a vertical 3D memory array, comprising:
forming a trench in a serpentine shape through a plurality of conductive layers and a plurality of dielectric layers of the vertical 3D memory array, the trench exposing a substrate and dividing the plurality of conductive layers into a first set of word lines and a second set of word lines;
forming, in each of a plurality of openings in the trench and in accordance with the serpentine shape of the trench, a plurality of spacers contacting at least the first set of word lines and the second set of word lines thus reducing a size of each opening based at least in part on etching a conformal material and a first dielectric material deposited in the trench;
filling an interspace between each plurality of spacers along the first set of word lines and the second set of word lines with a chalcogenide material in accordance with the serpentine shape of the trench; and
depositing a conductive material in each opening.

23. The method of claim 22, wherein:
each of the plurality of spacers is positioned at a respective corner wall between the first set of word lines or the second set of word lines and the conformal material exposed by the forming the opening.

24. The method of claim 22, wherein:
forming the plurality of spacers comprises an area-selective atomic layer deposition (ALD).

25. The method of claim 24, wherein:
each of the plurality of spacers is formed at a respective corner wall of the conformal material based on the area-selective atomic layer deposition (ALD).

26. The method of claim 24, wherein the area-selective atomic layer deposition (ALD) comprises acetylacetone as an inhibitor, bis(diethylamino) silane (BDEAS) as a Si precursor, and $O_2$ plasma as a co-reactant.

27. The method of claim 22, wherein:
each of the plurality of spacers comprises a dielectric material.

28. The method of claim 27, wherein:
the dielectric material may be selected among a group of: $SiO_2$, $GeO_2$, $SiN_x$, or $WO_3$.

* * * * *